United States Patent
Loopstra et al.

(10) Patent No.: US 9,983,482 B2
(45) Date of Patent: May 29, 2018

(54) RADIATION COLLECTOR, RADIATION SOURCE AND LITHOGRAPHIC APPARATUS

(71) Applicants: ASML Netherlands B.V., Veldhoven (NL); Carl Zeiss SMT GmbH, Oberkochen (DE)

(72) Inventors: Erik Roelof Loopstra, Eindhoven (NL); Olav Waldemar Vladimir Frijns, Rosmalen (NL); Stig Bieling, Aalen (DE); Antonius Theodorus Wilhelmus Kempen, Rosmalen (NL); Ivo Vanderhallen, Eindhoven (NL); Nicolaas Ten Kate, Almkerk (NL); Ruud Antonius Catharina Maria Beerens, Roggel (NL); Richard Henricus Adrianus Van Lieshout, Batenburg (NL); Theodorus Petrus Maria Cadee, Asten (NL); Sjoerd Nicolaas Lambertus Donders, Vught (NL); Alexander Matthijs Struycken, Eindhoven (NL); Marcus Petrus Scheepers, Dongen (NL)

(73) Assignees: ASML Netherlands B.V., Veldhoven (NL); Carl Zeiss SMT GmbH, Oberkochen (DE)

(*) Notice: Subject to any disclaimer, the term of this patent is extended or adjusted under 35 U.S.C. 154(b) by 38 days.

(21) Appl. No.: 14/775,263

(22) PCT Filed: Feb. 26, 2014

(86) PCT No.: PCT/EP2014/053753
§ 371 (c)(1),
(2) Date: Sep. 11, 2015

(87) PCT Pub. No.: WO2014/154433
PCT Pub. Date: Oct. 2, 2014

(65) Prior Publication Data
US 2016/0026091 A1  Jan. 28, 2016

Related U.S. Application Data

(60) Provisional application No. 61/805,603, filed on Mar. 27, 2013, provisional application No. 61/856,165, filed on Jul. 19, 2013.

(51) Int. Cl.
*G03B 27/54* (2006.01)
*G03F 7/20* (2006.01)
(Continued)

(52) U.S. Cl.
CPC ....... *G03F 7/70033* (2013.01); *G02B 5/0891* (2013.01); *G02B 19/0095* (2013.01);
(Continued)

(58) Field of Classification Search
CPC .............. G02B 19/0095; G02B 5/0891; G03F 7/70033; G03F 7/70166; G03F 7/702; G03F 7/70916; G03F 7/70983; G21K 1/067
(Continued)

(56) References Cited

U.S. PATENT DOCUMENTS 4,242,588 A   12/1980  Silk et al.
6,285,737 B1   9/2001  Sweatt et al.
(Continued)

FOREIGN PATENT DOCUMENTS

JP   2012-028813 A   2/2012
JP   2012-049526 A   3/2012
(Continued)

OTHER PUBLICATIONS

Chapman, H.N., et al., "A Novel Condenser for EUV Lithography Ring-Field Projection Optics," Proceedings of SPIE: EUV, X-Ray, and Neutron Optics and Sources, vol. 3767, Jul. 1999; pp. 225-236.
(Continued)

*Primary Examiner* — Peter B Kim
(74) *Attorney, Agent, or Firm* — Sterne, Kessler, Goldstein & Fox P.L.L.C.

(57) ABSTRACT

A radiation collector comprising a first collector segment comprising a plurality of grazing incidence reflector shells configured to direct radiation to converge in a first location at a distance from the radiation collector, a second collector
(Continued)

segment comprising a plurality of grazing incidence reflector shells configured to direct radiation to converge in a second location at said distance from the radiation collector, wherein the first location and the second location are separated from one another.

18 Claims, 12 Drawing Sheets

(51) Int. Cl.
  *G21K 1/06* (2006.01)
  *G02B 5/08* (2006.01)
  *G02B 19/00* (2006.01)
  *H05G 2/00* (2006.01)

(52) U.S. Cl.
  CPC .......... *G03F 7/702* (2013.01); *G03F 7/70166* (2013.01); *G03F 7/70916* (2013.01); *G03F 7/70983* (2013.01); *G21K 1/067* (2013.01); *H05G 2/008* (2013.01); *H05G 2/003* (2013.01)

(58) Field of Classification Search
  USPC .......................................................... 355/67
  See application file for complete search history.

(56) References Cited

U.S. PATENT DOCUMENTS

| | | | |
|---|---|---|---|
| 7,312,462 B2 | 12/2007 | Singer et al. | |
| 2002/0014599 A1 | 2/2002 | Rauch et al. | |
| 2005/0077483 A1 | 4/2005 | Bakker et al. | |
| 2005/0094764 A1 | 5/2005 | Weiss | |
| 2006/0000985 A1 | 1/2006 | Chandhok et al. | |
| 2007/0001131 A1 | 1/2007 | Ershov et al. | |
| 2008/0231820 A1 | 9/2008 | Wassink | |
| 2009/0073401 A1 | 3/2009 | Buis et al. | |
| 2010/0259733 A1 | 10/2010 | Franken et al. | |
| 2011/0242515 A1 | 10/2011 | Ceglio et al. | |
| 2012/0050704 A1 | 3/2012 | Levesque et al. | |
| 2012/0216681 A1 | 8/2012 | Metzmacher et al. | |
| 2014/0253894 A1* | 9/2014 | Van Schoot | G03F 7/70033 355/67 |

FOREIGN PATENT DOCUMENTS

| | | |
|---|---|---|
| JP | 2013-505573 A | 2/2013 |
| NL | 2009352 A | 3/2013 |
| WO | WO 00/08526 A1 | 2/2000 |

OTHER PUBLICATIONS

International Search Report directed to related International Patent Application No. PCT/EP2014/053753, dated Jul. 10, 2014; 4 pages.
International Preliminary Report on Patentability and Written Opinion of the International Searching Authority directed to related International Patent Application No. PCT/EP2014/053753, dated Sep. 29, 2015; 7 pages.

* cited by examiner

RADIATION COLLECTOR, RADIATION SOURCE AND LITHOGRAPHIC APPARATUS

CROSS-REFERENCE TO RELATED APPLICATIONS

This application claims the benefit of U.S. provisional application 61/805,603 which is filed on Mar. 27, 2013 and of U.S. provisional application 61/856,165, which is filed on Jul. 19, 2013, and which are incorporated herein in its entirety by reference.

FIELD

The present invention relates to a radiation collector and to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a radiation source for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be configured to receive the radiation and focus the radiation into a beam. The radiation source may include an enclosing structure or chamber arranged to provide a vacuum environment to support the plasma. Such a radiation system is typically termed a laser produced plasma (LPP) source.

SUMMARY

It is desirable to provide a radiation collector and/or a lithographic apparatus which is novel and inventive over the prior art.

According to an aspect of the invention, there is provided a radiation collector comprising a first collector segment comprising a plurality of grazing incidence reflector shells configured to direct radiation to substantially converge in a first location at a distance from the radiation collector, and a second collector segment comprising a plurality of grazing incidence reflector shells configured to direct radiation to substantially converge in a second location at said distance from the radiation collector, wherein the first location and the second location are separated from one another.

The radiation collector may further comprise one or more additional collector segments, wherein each additional collector segment comprises a plurality of grazing incidence reflector shells configured to direct radiation to substantially converge in a location at said distance from the radiation collector, wherein the location of each additional collector segment is separate from the respective locations of the other collector segments.

For instance, the radiation collector may further comprise a third collector segment comprising a plurality of grazing incidence reflector shells configured to direct radiation to substantially converge in a third location at said distance from the radiation collector, wherein the third location is separated from the first location and from the second location.

The radiation collector may further comprise a fourth collector segment comprising a plurality of grazing incidence reflector shells configured to direct radiation to substantially converge in a fourth location at said distance from the radiation collector, wherein the fourth location is separated from the first location, from the second location and from the third location The collector segments may be disposed around an optical axis of the radiation collector.

Each collector segment may comprise a respective angular portion of the radiation collector. As an example the first collector segment may comprise a first angular portion of the radiation collector and the second collector segment may comprise a second angular portion of the radiation collector.

The radiation collector may extend substantially circumferentially around the optical axis.

The radiation directed by the radiation collector may define a volume through which substantially no radiation which is directed by the radiation collector passes.

The cross-sectional area of the volume may increase with distance from the radiation collector. The cross-sectional area of the volume may monotonically increase with distance from the radiation collector.

The first location and the second location, and where applicable the third and fourth location, may be situated substantially equidistant from the optical axis.

The radiation directed by the first collector segment to the first location may form a first intensity distribution of radiation at a far-field location, and the radiation directed by the second collector segment to the second location may form a second intensity distribution of radiation at the far-field location.

There may be substantially no overlap between the first intensity distribution and the second intensity distribution at the far field location.

According to a second aspect of the invention, there is provided a radiation collector comprising a first collector segment comprising a plurality of grazing incidence reflector shells configured to direct radiation to a first location, a second collector segment comprising a plurality of grazing incidence reflector shells configured to direct radiation to a second location, wherein the first location and the second location are separated from one another.

The radiation collector may further comprise a third collector segment comprising a plurality of grazing incidence reflector shells configured to direct radiation to a third location, wherein the third location is separated from the first location and from the second location.

The radiation collector may further comprise a fourth collector segment comprising a plurality of grazing incidence reflector shells configured to direct radiation to a fourth location, wherein the fourth location is separated from the first location, from the second location and from the third location.

The first collector segment and the second collector segment may be disposed around an optical axis of the radiation collector.

The first collector segment may comprise a first angular portion of the radiation collector and the second collector segment may comprise a second angular portion of the radiation collector.

The radiation collector may extend substantially circumferentially around the optical axis.

The first location and the second location may be situated substantially equidistant from the optical axis.

The radiation directed by the first collector segment to the first location may form a first intensity distribution of radiation at a far-field location, and the radiation directed by the second collector segment to the second location may form a second intensity distribution of radiation at the far-field location.

There may be substantially no overlap between the first intensity distribution and the second intensity distribution at the far field location.

The radiation directed by the radiation collector may define a volume through which substantially no radiation which is directed by the radiation collector passes.

The cross-sectional area of the volume may monotonically increase with distance from the radiation collector.

According to a third aspect of the invention, there may be provided a radiation source comprising a fuel source configured to deliver fuel to a location from which the fuel emits EUV radiation, and a radiation collector according to the first or second aspect of the invention.

The collector segments may be disposed around an optical axis of the radiation collector, in which case the location from which the fuel emits EUV radiation may be positioned on or near to the optical axis.

The radiation directed by the radiation collector may define a volume through which substantially no radiation which is directed by the radiation collector passes, in which case the radiation source may further comprise a mirror, wherein the mirror is disposed inside the volume, and wherein the mirror is configured to focus a laser beam to the location from which the fuel emits EUV radiation.

The radiation directed by the radiation collector may define a volume through which substantially no radiation which is directed by the radiation collector passes. The radiation source may further comprise a contaminant trap in between the fuel source and the radiation collector, wherein the contaminant trap comprises a trap section configured to trap contaminants, and a drive system configured to rotate the trap section about a central axis of the contaminant trap, wherein at least a part of the drive system is disposed inside the volume.

According to a fourth aspect of the invention there may be provided a radiation source comprising a fuel source configured to deliver fuel to a location from which the fuel emits EUV radiation, wherein the radiation source further comprises a radiation collector, the radiation collector comprising a first collector segment comprising a plurality of grazing incidence reflector shells configured to direct radiation to a first location, a second collector segment comprising a plurality of grazing incidence reflector shells configured to direct radiation to a second location, wherein the first location and the second location are separated from one another.

The radiation collector may further comprise a third collector segment comprising a plurality of grazing incidence reflector shells configured to direct radiation to a third location, wherein the third location is separated from the first location and from the second location.

The radiation collector may further comprise a fourth collector segment comprising a plurality of grazing incidence reflector shells configured to direct radiation to a fourth location, wherein the fourth location is separated from the first location, from the second location and from the third location.

The first collector segment and the second collector segment may be disposed around an optical axis of the radiation collector.

The location from which the fuel emits EUV radiation may be positioned on or near to the optical axis.

The radiation directed by the radiation collector may define a volume through which substantially no radiation which is directed by the radiation collector passes.

The radiation source may further comprise a mirror, wherein the mirror is disposed inside the volume and wherein the mirror is configured to focus a laser beam to the location from which the fuel emits EUV radiation.

According to a fifth aspect of the invention, there is provided a lithographic apparatus comprising a radiation source according to the third or fourth aspect of the invention, wherein the lithographic apparatus is arranged to project EUV radiation from the radiation source onto a substrate.

According to a sixth aspect of the invention there is provided a lithographic apparatus arranged to project EUV radiation from a radiation source onto a substrate, wherein the radiation source comprises a fuel source configured to deliver fuel to a location from which the fuel emits EUV radiation, wherein the radiation source further comprises a radiation collector, wherein the radiation collector comprising a first collector segment comprising a plurality of grazing incidence reflector shells configured to direct radiation to a first location, a second collector segment comprising a plurality of grazing incidence reflector shells configured to direct radiation to a second location, wherein the first location and the second location are separated from one another.

The radiation collector may further comprise a third collector segment comprising a plurality of grazing incidence reflector shells configured to direct radiation to a third location, wherein the third location is separated from the first location and from the second location.

The radiation collector may further comprise a fourth collector segment comprising a plurality of grazing incidence reflector shells configured to direct radiation to a fourth location, wherein the fourth location is separated from the first location, from the second location and from the third location.

According to a seventh aspect of the invention there is provided a contaminant trap comprising a trap section configured to trap contaminants, a hole extending through a central region of the trap section, and a drive system configured to rotate the trap section about a central axis of the contaminant trap, the central axis extending through the hole, wherein the drive system is situated at a radially distal position from the central axis.

The drive system may be an asynchronous inductance motor.

The trap section may comprise a series of foil sheets which extend radially outwards from the outer perimeter of the hole.

The contaminant trap may further comprise one or more shields, wherein the one or more shields are configured to prevent contaminants from entering the drive system.

The position of the contaminant trap along the central axis may be maintained by one or more bearings.

One or more pre-tension bearings may be positioned on a first side of the contaminant trap and one or more magnetic reluctance bearings are positioned on a second side of the contaminant trap.

According to a eighth aspect of the invention there is provided a contaminant trap comprising an inner ring having a first radius and being disposed around a central axis of the contaminant trap, an outer ring having a second radius and being disposed around the central axis, wherein the second radius is greater than the first radius and wherein the outer ring comprises a plurality of spring sections, the spring sections being radially moveable relative to the outer ring, a plurality of foil sheets wherein each foil sheet extends between the inner ring and the outer ring and wherein the radially distal ends of the foil sheets are each attached to a spring section of the outer ring.

The outer ring may comprise a first ring and a second ring joined by a plurality of bridging sections, wherein the first ring and the second ring each comprise a plurality of spring sections, the spring sections being radially moveable relative to the first and second rings and wherein the radially distal ends of the foil sheets are each attached to a spring section of the first ring and a spring section of the second ring.

The bridging sections may define openings through which contaminants which impact the foil sheets may be flung radially outwards.

The contaminant trap may further comprise a motor configured to drive the contaminant trap to rotate.

According to a ninth aspect of the invention there is provided a radiation source comprising a fuel source configured to deliver fuel to a location from which the fuel emits EUV radiation, wherein the radiation source further comprises a contaminant trap comprising an inner ring having a first radius and being disposed around a central axis of the contaminant trap, an outer ring having a second radius and being disposed around the central axis, wherein the second radius is greater than the first radius and wherein the outer ring comprises a plurality of spring sections, the spring sections being radially moveable relative to the outer ring, and a plurality of foil sheets wherein each foil sheet extends between the inner ring and the outer ring and wherein radially distal ends of the foil sheets are each attached to a spring section of the outer ring.

According to a tenth aspect of the invention there is provided a lithographic apparatus arranged to project EUV radiation from a radiation source onto a substrate, the radiation source comprising a contaminant trap which comprises an inner ring having a first radius and being disposed around a central axis of the contaminant trap, an outer ring having a second radius and being disposed around the central axis, wherein the second radius is greater than the first radius and wherein the outer ring comprises a plurality of spring sections, the spring sections being radially moveable relative to the outer ring, a plurality of foil sheets wherein each foil sheet extends between the inner ring and the outer ring and wherein radially distal ends of the foil sheets are each attached to a spring section of the outer ring.

According to an eleventh aspect of the invention there is provided a contaminant trap having a central axis and comprising a plurality of fibres which extend between a first position at a first radial distance from the central axis and a second position at a second radial distance from the central axis and wherein the second radial distance is greater than the first radial distance.

The plurality of fibres may be carbon-carbon fibres.

The contaminant trap may further comprise a motor configured to drive the contaminant trap to rotate The plurality of fibres may be arranged in a plurality of rows of fibres.

The plurality of rows of fibres may be arranged substantially parallel to the central axis.

According to a twelfth aspect of the invention there is provided a radiation source comprising a fuel source configured to deliver fuel to a location from which the fuel emits EUV radiation, wherein the radiation source further comprises a contaminant trap having a central axis and comprising a plurality of fibres which extend between a first position at a first radial distance from the central axis and a second position at a second radial distance from the central axis and wherein the second radial distance is greater than the first radial distance.

According to a thirteenth aspect of the invention there is provided a lithographic apparatus arranged to project EUV radiation from a radiation source onto a substrate, the radiation source comprising a contaminant trap having a central axis and comprising a plurality of fibres which extend between a first position at a first radial distance from the central axis and a second position at a second radial distance from the central axis and wherein the second radial distance is greater than the first radial distance.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
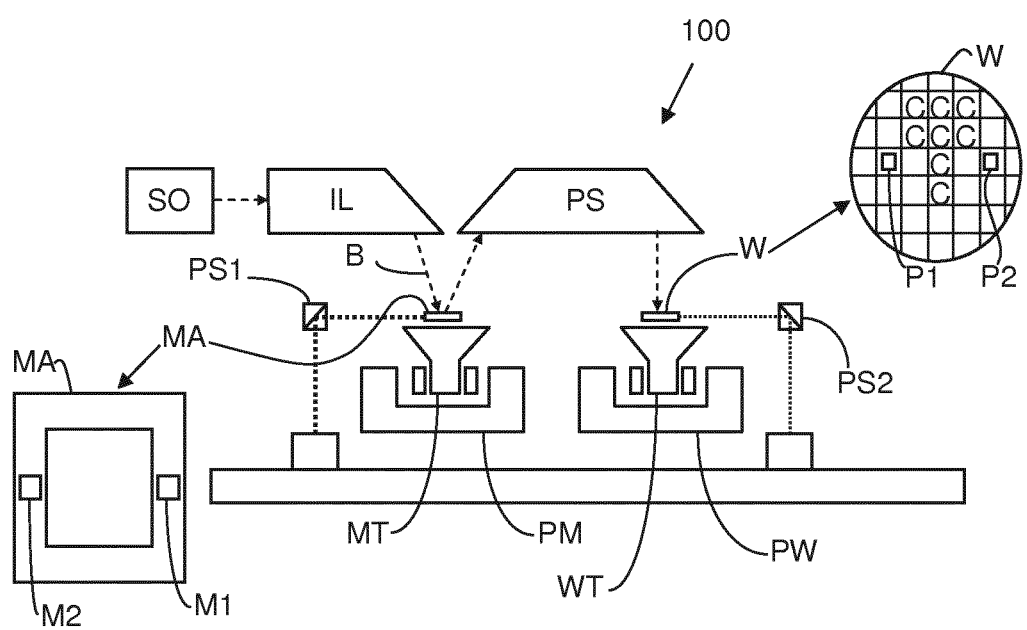
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, or structurally similar elements. The drawing in which an element first appears is indicated by the leftmost digit(s) in the corresponding reference number.

DETAILED DESCRIPTION

This specification discloses embodiments that incorporate the features of this invention. The disclosed embodiments merely exemplify the invention. The scope of the invention is not limited to the disclosed embodiments. The invention is defined by the claims appended hereto.

The embodiments described, and references in the specification to "one embodiment," "an embodiment," "an example embodiment," "some embodiments," etc., indicate that the embodiments described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus 100 including a radiation source SO according to one embodiment of the invention. The apparatus comprises:

an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the radiation source SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The radiation source SO may be part of an EUV radiation system including a laser, not shown in FIG. 1, for providing the laser beam exciting the fuel. The resulting plasma emits output radiation, e.g., EUV radiation, which is collected using a radiation collector, disposed in the radiation source. The laser and the radiation source may be separate entities, for example when a CO2 laser is used to provide the laser beam for fuel excitation.

In such cases, the laser is not considered to form part of the lithographic apparatus and the laser beam is passed from the laser to the radiation source with the aid of a beam delivery system comprising, for example, suitable directing mirrors and/or a beam expander.

In an alternative method, often termed discharge produced plasma ("DPP") the EUV emitting plasma is produced by using an electrical discharge to vaporise a fuel. The fuel may be an element such as xenon, lithium or tin which has one or more emission lines in the EUV range. The electrical discharge may be generated by a power supply which may form part of the radiation source or may be a separate entity that is connected via an electrical connection to the radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
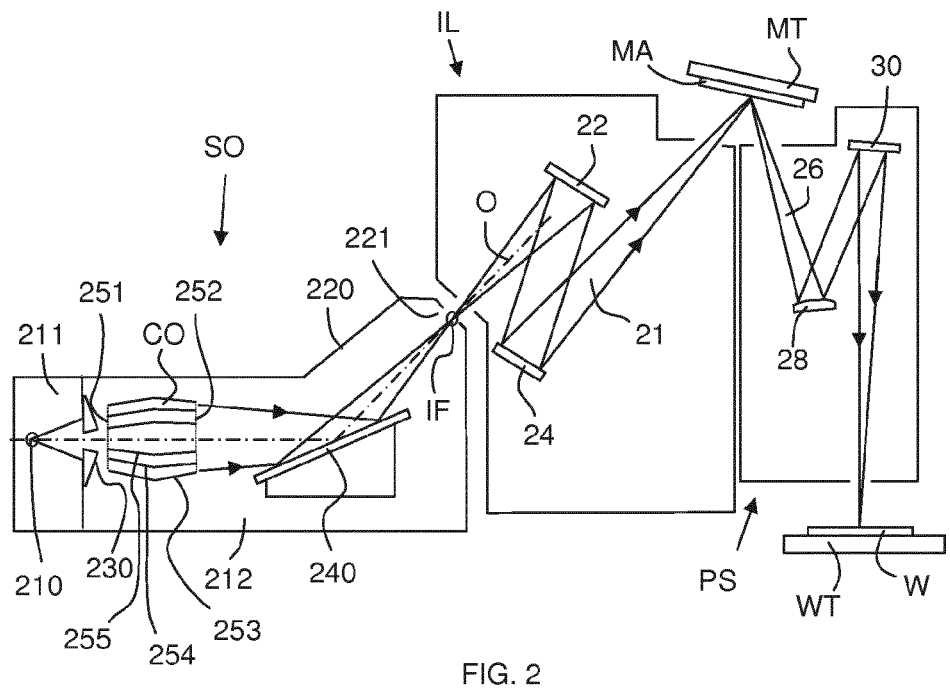
FIG. 2 is a more detailed view of the lithographic apparatus.

FIG. 2 shows the lithographic apparatus in more detail, including the radiation source SO, the illumination system IL, and the projection system PS. The radiation source SO is constructed and arranged such that a vacuum environment can be maintained in an enclosing structure 220 of the radiation source SO. An EUV radiation emitting plasma 210 may be formed by a laser produced plasma source LPP or a discharge produced plasma source DPP.

EUV radiation may be produced by a gas or vapor, for example Xe gas, Li vapor or Sn vapor in which the very hot plasma 210 is created to emit radiation in the EUV range of the electromagnetic spectrum.

In the case of a laser produced plasma source LPP, a laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma.

In the case of a discharge produced plasma source DPP, the very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses radiation collector CO can optionally be reflected off a grating spectral filter 240 to be focused in a virtual source point IF. The virtual source point IF is commonly referred to as the intermediate focus, and the radiation source is arranged such that the intermediate focus IF is located at a distance from the radiation collector at or near an opening 221 in the enclosing structure 220. The intermediate focus IF is an image of the radiation emitting plasma 210. For ease of illustration, the radiation source SO is depicted in FIG. 2 as having a single intermediate focus IF at or near an opening 221. However, in practice the radiation source SO may focus radiation in a plurality of intermediate focuses IF at or near a plurality of openings (as is explained further below).

Subsequently, the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more minors present than those shown in the Figures, for example there may be 1-6 additional reflective elements present in the projection system PS than shown in FIG. 2.

Radiation collector CO, as illustrated in FIG. 2, is a nested collector with grazing incidence reflector shells 253, 254 and 255. The grazing incidence reflector shells 253, 254 and 255 may be disposed axially symmetric around an optical axis O.

Figure 3:
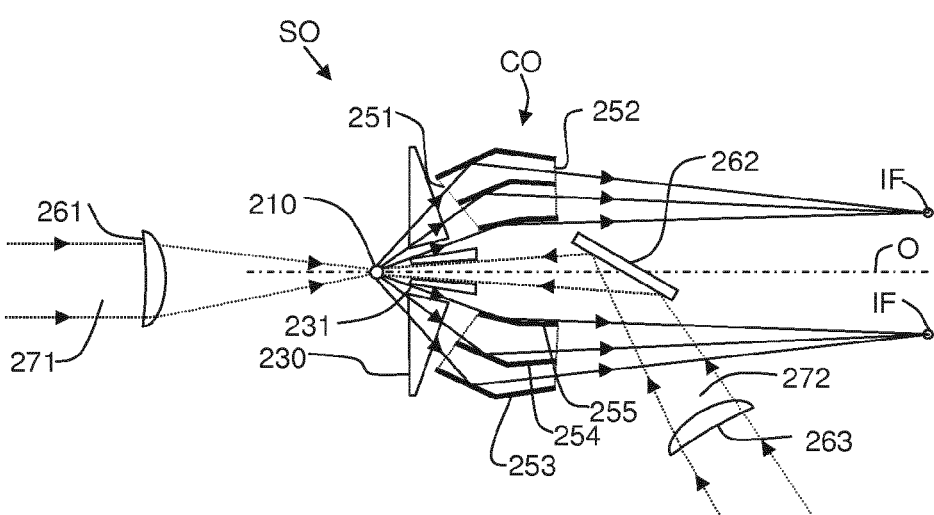
FIG. 3 is a more detailed view of part of the radiation source SO of the apparatus of FIGS. 1 and 2.

FIG. 3 illustrates a laser produced plasma (LPP) embodiment of the radiation source SO. EUV emitting plasma 210 may be created, for example, by directing a first laser beam 271 then a second laser beam 272 at a fuel. The fuel may be particles of a suitable material (e.g. tin), or a stream of a suitable gas or vapor, such as Xe gas or Li vapor. The fuel may be delivered by a fuel delivery apparatus (not shown) such that the fuel is delivered to a location at which the plasma 210 is to be formed. For example, droplets of fuel may be delivered by a fuel delivery apparatus along a path which intersects with the optical axis O. The fuel droplets may be intercepted by the first laser beam 271 and then by the second laser beam 272, thereby causing the fuel to emit EUV radiation.

The first laser beam 271 is a pre-pulse laser beam. The pre-pulse laser beam 271 is focussed by a lens 261 onto the fuel. The lens 261 may have a large numerical aperture. For example the lens 261 may have a numerical aperture in the range 0.05-0.15. In alternative embodiments the lens 261 is replaced by a minor having a large numerical aperture and the pre-pulse laser beam 271 is reflected by the mirror and focussed onto the fuel. The pre-pulse laser beam 271 may expand a droplet of fuel into a mist of fuel at the location at which the plasma 210 is to be formed.

The second laser beam 272 is a main-pulse laser beam. The main-pulse laser beam 272 may have an intensity several times larger than the intensity of the pre-pulse laser beam 271. For example the main-pulse laser beam 272 may have an intensity of between 10 and 100 times (or more) the intensity of the pre-pulse laser beam 271. The main-pulse laser beam 272 may for example be formed by a CO2 laser. The main-pulse laser beam 272 is focussed by a lens 263 onto a main-pulse minor 262. The lens 263 may for example have a smaller numerical aperture than the lens 261 used to focus the pre-pulse laser beam. In alternative embodiments, the lens 263 is replaced by a focussing mirror, and the main-pulse laser beam 263 is reflected by the focussing mirror and focussed onto the main-pulse mirror 262.

The main-pulse laser beam 272 is reflected and focussed by the main-pulse minor 262 onto the mist of fuel created by the pre-pulse laser beam 271. The main-pulse laser beam 272 converts the mist of fuel into a plasma 210. The plasma 210 emits EUV radiation. The EUV radiation is collected by the radiation collector CO and directed to intermediate focuses IF. Although the radiation collector CO is depicted in FIG. 3 as focussing EUV radiation directly to intermediate focuses IF, one or more reflective or transmissive optical elements may be added to the path of the EUV radiation before it reaches the intermediate focuses IF. The one or more optical elements may for example include a grating spectral filter 240 as depicted in FIG. 2.

The term intermediate focus IF is used herein to denote a location at which radiation directed by a radiation collector CO substantially converges. The radiation collector CO directs radiation such that radiation from the plasma 210, incident on different portions of the radiation collector CO, substantially converges at a plurality of locations, referred to throughout as intermediate focuses IF. In this embodiment, the intermediate focuses IF are all at substantially the same distances from the radiation collector CO.

The plasma 210 may emit EUV radiation with a non-isotropic distribution. In particular, the plasma 210 may preferentially emit EUV radiation in the hemispherical direction from which it received the main-pulse laser beam 272. It is therefore advantageous to generate the plasma using a main-pulse laser beam 272 which is incident on the plasma 210 from the collector side of the plasma, such that the plasma preferentially emits EUV radiation towards the radiation collector CO. This leads to a greater intensity of EUV radiation at the intermediate focuses IF than would otherwise be the case. In other embodiments the pre-pulse laser beam 271 and the main-pulse laser beam 272 may both be incident on the fuel from the collector side of the fuel.

The radiation collector CO is a grazing incidence radiation collector comprising three mirrored grazing incidence reflector shells 253, 254 and 255. In an embodiment the radiation collector CO comprises two or more grazing incidence reflector shells. For example in some embodiments the radiation collector CO may comprise 4, 5, 6, 7, 8, 9 or more grazing incidence reflector shells.

The radiation collector CO is protected from contaminants originating from the plasma 210 by a contaminant trap 230. The contaminant trap 230 may be a rotating foil trap, static foil trap or any other form of contaminant trap. The contaminant trap may be rotated around the optical axis O by a hollow motor 231 which extends circumferentially around the optical axis O such that the main-pulse laser beam 272 may pass through the hollow motor 231 and along the optical axis O. Hollow motor 231 may be an inductance motor or any other suitable motor.

The contaminant trap 230 and the hollow motor 231 are optional components of the radiation source SO. Other embodiments of the radiation source SO may additionally or alternatively include other debris mitigation systems such as one or more gas barriers. Alternatively, the radiation source may not include a contaminant trap 230 or a hollow motor 231.

Each grazing incidence reflector shell 253, 254 and 255 extends from the upstream collector side 251 to the downstream collector side 252. A grazing incidence reflector shell may form a substantially constant angle with the optical axis along its length. A grazing incidence reflector shell may alternatively form a different angle with the optical axis O at different points along its length. For example a grazing incidence reflector shell may form 2, 3, 4 or more angles with the optical axis O along its length. In alternative embodiments a grazing incidence reflector shell may form an angle with the optical axis O which changes continuously along its length such that the grazing incidence reflector shell is substantially curved relative to the optical axis O.

Each grazing incidence reflector shell may comprise a plurality of segments which each extend around a different angular portion of the optical axis O. Each grazing incidence reflector shell may comprise the same number of segments. This may be equal to the number of intermediate focuses IF to which the radiation collector CO directs radiation. The segments of a reflector shell may be situated substantially equidistant from the optical axis O.

Figure 4:
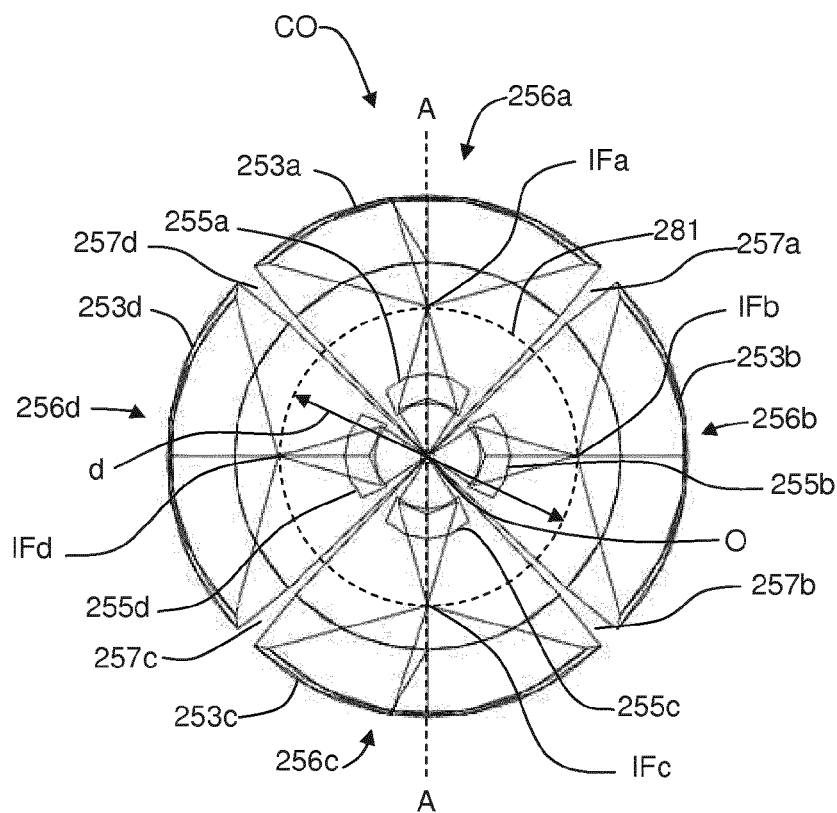
FIG. 4 depicts a radiation collector CO of the radiation source SO viewed from along an optical axis O of the radiation collector CO.

FIG. 4 depicts a radiation collector CO viewed from intermediate focuses IF along the optical axis O. For ease of illustration only an inner grazing incidence reflector shell 255 and an outer grazing incidence reflector shell 253 are depicted in FIG. 4. The radiation collector CO may however further comprise one or more grazing incidence reflector shells disposed between the outer grazing incidence reflector shell 253 and the inner grazing incidence reflector shell 255. Both the outer grazing incidence reflector shell 253 and the inner grazing incidence reflector shell 255 each comprise four segments 253a-d and 255a-d respectively.

The inner grazing incidence reflector segment 255a occupies a substantially similar angular range as its associated outer grazing incidence reflector segment 253a. The inner segment 255a and the outer segment 253a are orientated such that they both direct EUV radiation to a common intermediate focus IFa. The other inner segments 255b-d and associated outer segments 253b-d are analogously orientated so as to direct EUV radiation to intermediate focuses IFb, IFc and IFd respectively. Each inner grazing incidence reflector segment 255a-d and outer grazing incidence reflector segment 253a-d form four collector segments 256a-d which direct EUV radiation to four intermediate focuses IFa-d respectively.

In alternative embodiments, the collector segments 256a-d further comprise one or more additional grazing incidence reflectors disposed in-between the outer grazing incidence reflector segments 253a-d and the inner grazing incidence reflector segments 255a-d. Each additional grazing incidence reflector segment may occupy a substantially similar angular range as the inner segments 255a-d and the outer segments 253a-d. Each additional grazing incidence reflector segment may direct EUV radiation to intermediate focuses IFa-d.

The term collector segment is intended to denote a portion of a radiation collector which directs radiation to a single location such as an intermediate focus IF. An intermediate focus IF is a point in space at which radiation from the plasma 210 substantially converges. The converging radiation forms an image of the plasma 210 at or near an opening 221 in the enclosing structure 220. The image of the plasma 210 formed at an intermediate focus IF may have a diameter which is smaller than the diameter of the opening 221 at or near which the intermediate focus IF is located. The opening 221 may for example have a diameter of approximately 7 mm. A collector segment may comprise a plurality of grazing incidence reflector shells. The grazing incidence reflector shells which comprise each collector segment may occupy a substantially similar angular range of the radiation collector CO.

Figure 5:
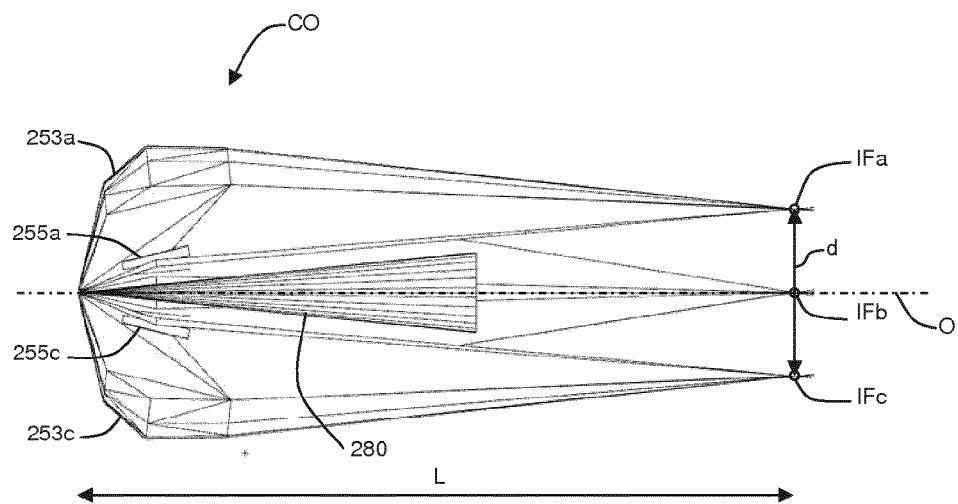
FIG. 5 is a side view of the radiation collector CO of FIG. 4.

FIG. 5 shows a cross-section of the radiation collector CO taken along a line A-A. As can be seen from FIG. 5, the path of the EUV radiation from the grazing incidence reflector segments to the intermediate focuses IFa-c defines a volume 280 through which substantially no EUV radiation which is collected and directed to intermediate focuses IFa-d passes. The volume 280 may be substantially conical, extending from the plasma 210 with a substantially circular cross-sectional area 281 (as shown in FIG. 4). The substantially circular cross-sectional area 281 has a diameter d at the location of the intermediate focuses IFa-d. For ease of illustration the volume 280 is depicted in FIG. 5 as extending only approximately half way along the optical axis O to the intermediate focuses IF. In practice however, the volume 280 extends along the optical axis O all the way to the intermediate focuses IF.

Whilst the volume 280 may have a substantially conical shape with a substantially circular cross-sectional area 281, in practice the volume 280 may vary from a conical shape and the cross-sectional area 281 may vary from a circular shape. For example the grazing incidence reflector segments may be positioned such that gaps exist between them, such as gaps, 257a-d depicted in FIG. 4. In the region of the gaps 257a-d the perimeter of the cross-sectional area 281 may include substantially linear segments in-between substantially circular segments.

In alternative embodiments the volume 280 may take other shapes, the shapes being defined by the inner paths (with respect to the optical axis O) of EUV radiation which is collected and directed to intermediate focuses IFa-d.

The cross-sectional area of the volume 280 may monotonically increase with distance from the radiation collector CO.

Components of the radiation source SO may be positioned inside the volume 280 without obstructing EUV radiation which would otherwise be collected by the radiation collector CO and directed to an intermediate focus IF. Components of the radiation source positioned outside of the volume 280 may obstruct EUV radiation which would otherwise have been directed to an intermediate focus IF, thereby reducing the intensity of EUV radiation at the intermediate focus IF. It is therefore desirable to position components of the radiation source inside the volume 280.

Components of the radiation source which may be positioned inside the volume 280 may include, for example, the main-pulse mirror 262 which reflects and focuses the main-pulse laser beam 272 onto the plasma 210. The main-pulse minor 262 may have a maximum numerical aperture which will fit inside the volume 250. The numerical aperture of the main-pulse mirror 262 may determine the focusing of the main-pulse laser beam at the location of the plasma 210. For example a main-pulse mirror 262 having a high numerical aperture may provide a main-pulse laser beam 272 which is more focused at the location of the plasma 210 than a main-pulse laser beam 272 which is reflected and focused by a main-pulse mirror 262 having a low numerical aperture. In general, the focused intensity of a main-pulse laser beam 272 at the location of the plasma 210 may increase with the numerical aperture of the main-pulse mirror 262. In general the amount of EUV radiation emitted by the plasma 210 may increase with the focused intensity of the main-pulse laser beam 272 at the location of the plasma 210. It may therefore be advantageous to provide a main-pulse minor 262 having a high numerical aperture such that the main-pulse laser beam 272 has a high focused intensity at the location of the plasma 210. However a focused intensity of the main-pulse laser beam 272 which is too high may produce a plasma 210 which emits EUV radiation at a shorter wavelength than desired. It may therefore be desirable to optimise the focused intensity of the main-pulse laser beam 272 in order to produce a plasma 210 which emits EUV radiation of a desired wavelength and intensity.

The size of a main-pulse mirror 262 which fits inside the volume 280 may be limited by the cross-sectional area 281 of the volume 280 in the region along the optical axis O at which the main-pulse minor 262 is positioned. The numerical aperture of a main-pulse minor 262 may depend both on the size of the main pulse mirror 262 and the distance from the plasma 210 at which the main-pulse mirror 262 is positioned.

In the embodiment depicted in FIG. 5, the cross-sectional area 281 of the volume 280 increases with distance along the optical axis O from the plasma 210. In this embodiment the size of a main-pulse mirror 262 which fits inside the volume 280 may be increased by positioning the main-pulse mirror further away from the plasma 210 along the optical axis O. Increasing the size of a main-pulse mirror 262 and positioning it further away from the plasma 210 may decrease the exposure of the main-pulse minor 262 to contaminants originating from the plasma 210. Additionally, using a larger main-pulse minor 262 may reduce the heat load on the main-pulse minor 262 from the main-pulse laser beam 272.

The maximum numerical aperture of a main-pulse mirror 262 which fits inside the volume 280 at a given distance from the plasma 210 may be increased by increasing the cross-sectional area 281 at the position of the main-pulse mirror 262. The cross-sectional area 281 of the volume 280 at a given distance from the plasma 210 may be increased by moving the positions of the intermediate focuses IFa-d apart from one another such that the diameter d of the substantially circular shape joining the intermediate focuses IFa-d increases. This may be achieved, for example, by tilting the upstream collector side 251 of the collector segments 256a-d towards the plasma 210 such that the positions of the intermediate focuses IFa-d move radially outwards from the optical axis O. This may increase the volume 280, thereby increasing the maximum numerical aperture of a main-pulse mirror which may fit inside the volume 280.

Hence, the intermediate focuses IFa-d in this embodiment all lie within a plane perpendicular to the optical axis O at substantially the same distance L from the radiation collector.

Although in this embodiment all intermediate focuses lie in the same plane, it is also envisaged that the two or more intermediate focuses lie in a first plane at a first distance from the radiation collector and two or more other intermediate focuses lie in a second plane at a second distance from the radiation collector, wherein the first distance is different from the second distance. However, this still falls within the scope of the invention as within the first or second plane, the respective intermediate focuses are located at different locations.

Tilting the upstream collector side 251 of the collector segments 256a-d towards the plasma 210 may change the angles at which EUV radiation emitted from the plasma is collected by the collector segments 256a-d. In particular the maximum angle and the minimum angle at which EUV radiation is collected may change as the upstream collector side 251 of the collector segments 256a-d are tilted towards the plasma 210. It may be desirable to tilt the upstream collector side 251 of the collector segments 256a-d towards the plasma 210 such that the difference between the maximum angle and the minimum angle remains substantially constant. The plasma 210 may emit EUV radiation with a non-isotropic intensity distribution and therefore changing the angles at which EUV radiation emitted from the plasma is collected by the collector segments 256a-d may change the total amount of EUV radiation collector by the radiation collector CO.

Other components of the radiation source SO which may be positioned inside the volume 280 may include the hollow motor 231 (see FIG. 3). Increasing the volume 280 may allow for greater flexibility in the sizing and positioning of the hollow motor 231 without obstructing EUV radiation which is collected and directed to an intermediate focus IF. It may be desirable to position other components of the radiation source SO inside the volume 280 such as additional optical components to focus the main-pulse laser beam 272.

The position of the intermediate focus points, i.e. intermediate focuses, relative to the optical axis O affects the intensity distribution of EUV radiation at a far field location such as, for example, the faceted field mirror device 22 as depicted in FIG. 2. The faceted field mirror device 22 may be configured along with the faceted pupil mirror device 24 to reflect the EUV radiation at the far field location so as to provide a radiation beam with a desired angular distribution at the patterning device MA, as well as a desired uniformity of radiation intensity at the patterning device MA.

Figure 6A:
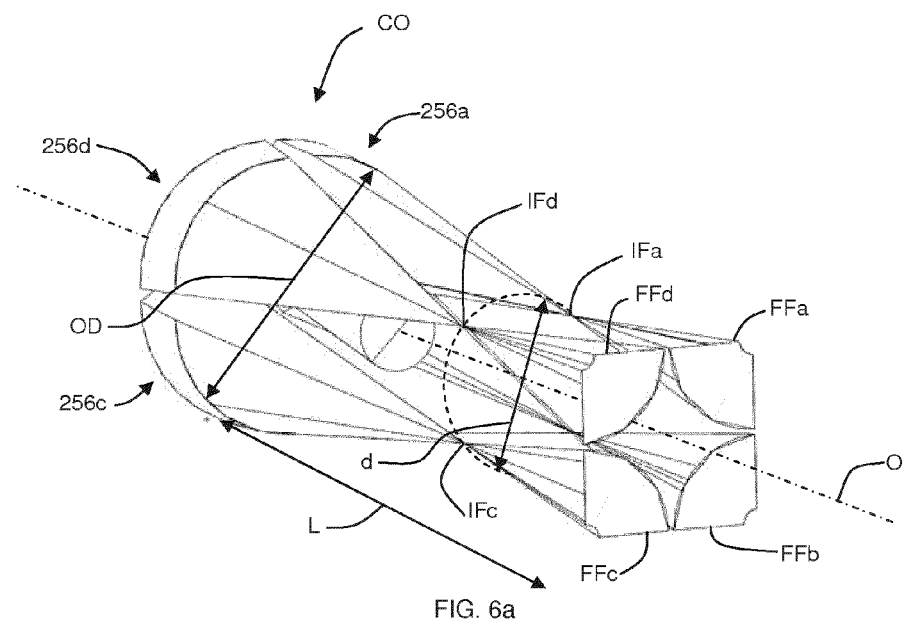
FIGS. 6a-c depict embodiments of the radiation collector CO and an intensity distribution of radiation at a far field location created by the radiation collectors.
Figure 6B:
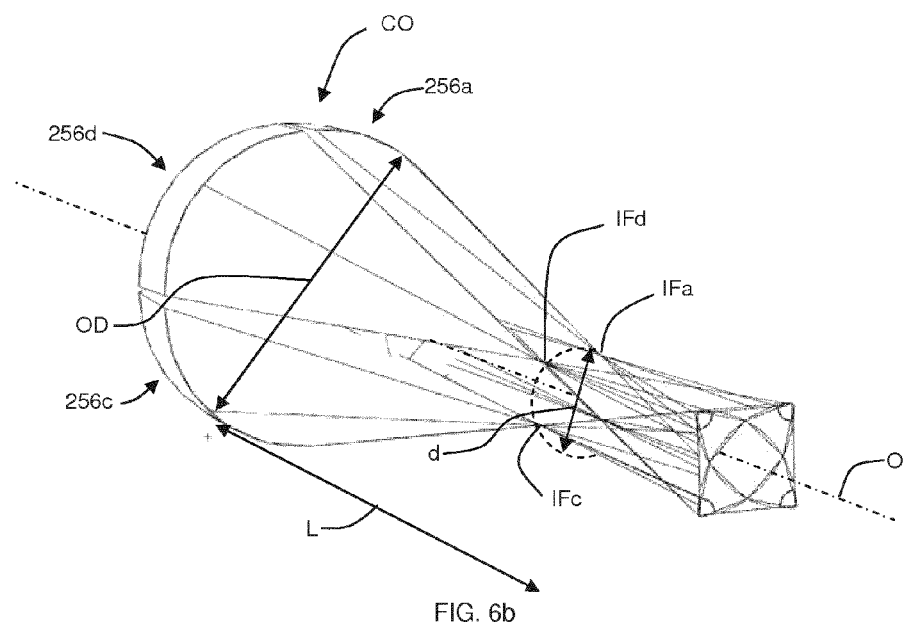
Figure 6C:
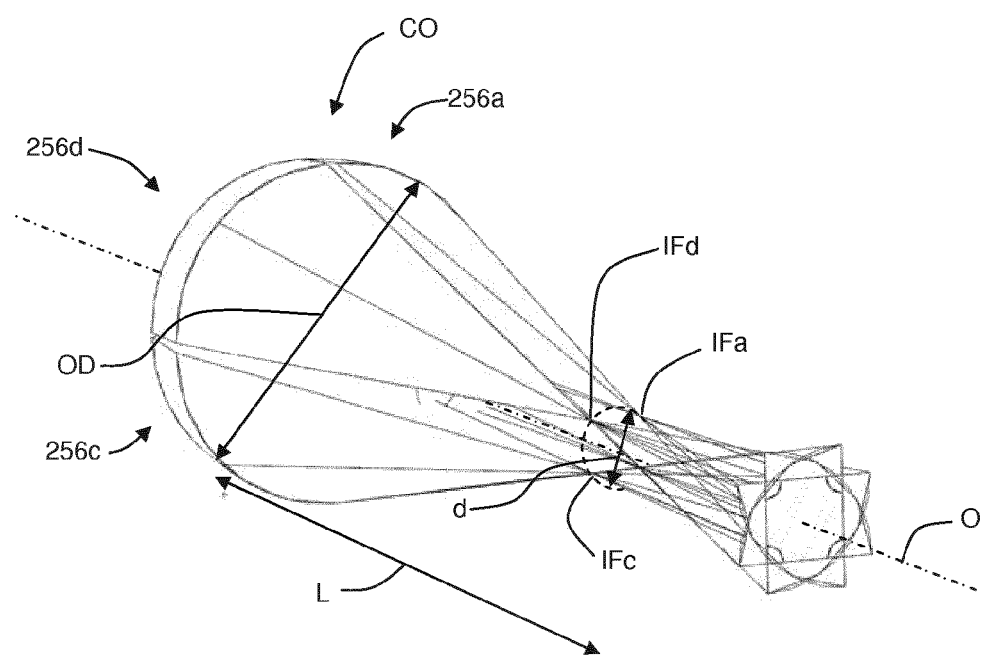

FIGS. 6a-c depict embodiments of a radiation source SO and the shape of an intensity distribution of EUV radiation at a far field location created by the radiation source SO. In each of the embodiments depicted in FIGS. 6a-c a radiation collector CO directs EUV radiation from a plasma 210 to intermediate focuses IFa-d. A distance L between the plasma 210 and the intermediate focuses IFa-d along an optical axis O may be approximately 200 cm. The radiation collector CO may have an outer diameter OD of approximately 70 cm. The diameter d of a circle joining intermediate focuses IFa-d may be approximately 21 cm, 10 cm and 7.5 cm in the embodiments of FIGS. 6a-c respectively.

The different diameters d of the circles joining the intermediate focuses IFa-d create different volumes 280 in which components of the radiation source SO may be positioned without obstructing EUV radiation which would otherwise be collected and directed to intermediate focuses IFa-d. In general the larger the diameter d of the circles joining the intermediate focuses IFa-d the larger the volume 280. It may therefore be advantageous to configure the radiation collector CO such that the diameter d is sufficiently large to create a sufficiently large volume 280 in which components of the radiation source SO may be positioned.

The different diameters d of the circles joining the intermediate focuses IFa-d in the embodiments of FIGS. 6a-c also create different intensity distributions of EUV radiation at a far field location. In the embodiment depicted in FIG. 6a each collector segment 256a-d directs beams of EUV radiation to one of four intermediate focuses IFa-d. The beams of EUV radiation are later incident on regions FFa-d at the far field location. Regions FFa-d in FIG. 6a do not overlap at the far field location and therefore the intensity of EUV radiation incident on the far field location may be substantially constant across regions of the far field location on which EUV radiation is incident. A faceted mirror device such as, for example, facetted field mirror device 22 (see FIG. 3) may be provided at the far field location. The faceted field mirror device 22 may easily be configured to reflect a substantially constant intensity distribution of EUV radiation (such as the intensity distribution created by the embodiment depicted in FIG. 6a) to provide a radiation beam with a desired angular distribution as well as a desired uniformity of radiation intensity.

The diameter d of the circles which join the intermediate focuses IFa-d in the embodiments depicted in FIG. 6b and FIG. 6c are both smaller then the equivalent diameter d in the embodiment depicted in FIG. 6a. As a consequence, the portions of EUV radiation which pass through each of the intermediate focuses IFa-d, overlap at the far field location. Some regions of the far field location therefore have incident upon them EUV radiation originating from more then one intermediate focus IF. Other regions of the far field location may have incident upon them EUV radiation originating from a single intermediate focus IF. The intensity of EUV radiation at the far field location may therefore include significant variation across regions of the far field location on which EUV radiation is incident. A faceted field mirror device may be configured to reflect such a non-constant intensity distribution of EUV radiation (such as the intensity distribution created by the embodiments depicted in FIG. 6b and FIG. 6c) to provide a radiation beam with a desired angular distribution, as well as a desired uniformity of radiation intensity. It may however be simpler to configure a faceted field mirror device to reflect an intensity distribution of EUV radiation to provide a radiation beam with a desired angular distribution and uniformity of intensity distribution, if the intensity distribution of EUV radiation is substantially constant as opposed to a substantially non-constant intensity distribution.

In alternative embodiments the radiation collector CO may comprise more or less than four collector segments. Each collector segment may direct EUV radiation to an associated intermediate focus. Thus, the number of intermediate focuses may be equal to the number of collector segments. For example, the radiation collector CO may comprise 2, 3, 4, 5, 6, 7, 8 or more collector segments which direct EUV radiation to 2, 3, 4, 5, 6, 7, 8 or more intermediate focuses respectively.

The number of collector segments and the number of intermediate focuses IF and the positioning of the intermediate focuses IF affect the shape and size of the volume 280. If the radiation collector CO were to comprise a single substantially cylindrical collector arranged to direct EUV radiation to a single intermediate focus (as is the case in the prior art), then the volume equivalent to volume 280 would be very limited. Furthermore, it would not have the continuously increasing cross-sectional area which for example the volume 280 shown in FIG. 5 has. Instead, it would have a cross-sectional area which would initially increase until a transition point, after which the cross-sectional area would decrease (decreasing to zero at the intermediate focus). Such an arrangement places significant restrictions on the maximum numerical aperture and position of a main-pulse mirror which may fit inside the volume.

The above disadvantage is overcome by radiation collectors CO according to the invention, in the manner described above. Radiation collectors CO according to embodiments of the invention comprise more than one collector segment 256 which direct EUV radiation to more than one intermediate focus point. A radiation collector CO which comprises more than two collector segments 256, and which directs radiation to more than two intermediate focuses IF, may further increase the volume 280 in which components of the radiation source may be positioned without substantially obstructing EUV radiation. It may therefore be further advantageous for a radiation collector CO to comprise more than two collector segments 256 which direct radiation to more than two intermediate focuses. For example, four collector segments 256, as illustrated in FIGS. 4 and 5, may be advantageous.

In embodiments of a radiation collector CO comprising more than one collector segment 256, EUV radiation may be directed to more than one intermediate focus IF which may be positioned at a substantial distance from the optical axis O. Any obstructions close to the optical axis O may therefore not have incident on them EUV radiation which would otherwise reach a far field location. A radiation collector CO comprising more than one collector segment 256 may therefore be used to avoid any obstructions close to the optical axis O, thereby reducing the amount of EUV radiation which is obstructed.

The dimensions of various embodiments of the radiation source SO mentioned above are purely examples of possible dimensions. It should be understood that embodiments of a radiation source SO may have other dimensions which may be suitable for the particular application of the radiation source SO. For example, in some embodiments of a radiation source SO it may be desirable to direct EUV radiation to intermediate focuses IF which are closer to or further away from a plasma 210 along an optical axis O than the embodiments depicted in FIGS. 6a-c. The distance along an optical axis O between a plasma 210 and intermediate focuses IF may be determined by the dimensions of the radiation source SO and in particular by the distance along the optical axis O of openings 221 in an enclosing structure 220 at or near which radiation is focused at intermediate focuses IF.

Although specific embodiments of the invention have been described and depicted in relation to a laser produced plasma source LPP, embodiments of the invention may also be used in conjunction with a discharge produced plasma source DPP. Embodiments of the invention may be advantageous in conjunction with a discharge produced plasma source DPP in that additional volume may be provided in which for example a debris mitigation apparatus may be positioned. Embodiments of the invention may also reduce obstruction of EUV radiation by any obstructions close to the optical axis O of a radiation source when used in conjunction with a discharge produced plasma source DPP.

Figure 7:
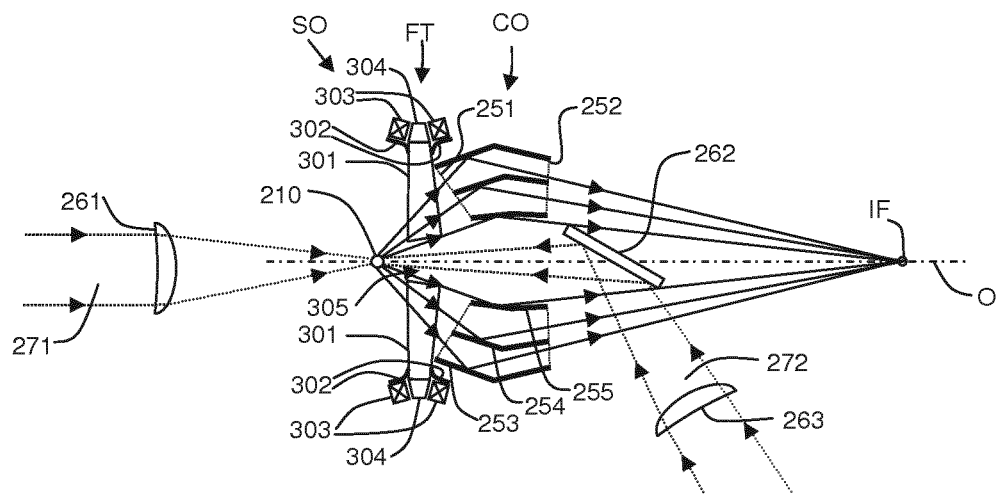
FIG. 7 is a detailed view of a radiation source SO having a foil trap FT according to an embodiment of the invention.

FIG. 7 depicts an embodiment of the radiation source SO including a foil trap FT. The foil trap FT is depicted in cross-section in FIG. 8. The foil trap FT acts to trap contaminants originating from the fuel and the plasma 210 and prevent the contaminants from contaminating the radiation collector CO. Contaminants from the fuel and the plasma 210 may include atoms, ions and particles of the fuel.

The foil trap comprises a trap section 301 having a substantially circular cross-section and a rotor section 304 which extends circumferentially around the outer perimeter of the trap section 301. The trap section comprises a series of foil sheets 306 which extend radially from the inner perimeter of the rotor section 304 to the outer perimeter of a hole 305 which extends through the centre of the foil trap FT. The hole 305 has a sufficient diameter to allow the main-pulse laser beam 272 to pass through the hole 305. Towards the outer perimeter of the trap section 301 of the foil trap FT, shields 302 extend from each side of the foil trap FT as depicted in FIG. 7.

The foil sheets 306 are sufficiently thin that EUV radiation incident on the foil trap is not substantially obstructed by the foil sheets 306. The foil sheets 306 therefore do not substantially reduce the total amount of EUV radiation which passes through the foil trap FT.

An outer perimeter of the foil trap FT is positioned between stator components 303. The stator components 303, which are radially distal from the optical axis O, may be any components which allow for the generation of a rotating magnetic field around the foil trap FT. The stator components may for example be a series of coils through which an AC current is passed in order to generate a rotating magnetic field around the foil trap FT. The rotor section 304 of the foil trap FT may comprise any material which causes the foil trap FT to rotate in the presence of the rotating magnetic field. The rotor section 304 may for example comprise a series of conducting regions such as regions of copper or aluminum.

The stator components 303 and the rotor section 304 together form an asynchronous inductance motor. The asynchronous inductance motor acts to rotate the foil trap with a centre of rotation at or near the optical axis O. The asynchronous inductance motor is radially distal from the optical axis O. The speed of rotation of the foil trap may be sufficiently high, relative to the speed of contaminants through the foil trap FT, that the rotating foil sheets 306 intercept a substantial portion of contaminants passing through the foil trap FT. The rotating foil sheets 306 therefore act to reduce the contaminants which reach the radiation collector CO. The shields 302 act to prevent contaminants from getting into a gap between the stator components 303 and the rotor section 304.

The foil trap FT may be heated during operation. The heating may, for example, occur as a result of exposure of the foil trap FT to EUV radiation. Heating of the foil trap FT may result in expansion of the foil trap FT. In particular the foil trap FT may expand radially outwards. By positioning the stator components 303 on either side of the rotor section 304, the foil trap FT may be free to expand radially outwards without coming into contact with the stator components 303.

The position of the foil trap FT along the optical axis O may be maintained by one or more bearings. The bearings may be positioned in-between the stator components 303 and the rotor section 304. One or more pre-tension bearings may be positioned on a first side of the rotor section 304. The one or more pre-tension bearings may hold the foil trap FT at a substantially constant position along the optical axis O. One or more magnetic reluctance bearings may be positioned on a second side of the rotor section 304. The one or more magnetic reluctance bearings may allow for some change in the radial and axial position of the foil trap FT due to expansion of the foil trap FT.

The foil trap FT may be rotated by a drive system other than an asynchronous inductance motor (the asynchronous inductance motor is merely an example of a drive system). For example, the foil trap FT may be rotated by another form of inductance motor, another form of electric motor or a gas turbine engine. The drive system may be provided close to the outer perimeter of the foil trap FT (i.e. radially distal from the optical axis O). Providing the drive system close to the outer perimeter of the foil trap FT allows the drive system to be protected from contaminants and/or EUV radiation from the plasma 210. Providing the drive system close to the outer perimeter of the foil trap FT also reduces the components of the foil trap FT which are positioned close to the optical axis O. Positioning less components of the foil trap FT close to the optical axis O provides additional space in the proximity of the optical axis O. The additional space may increase the cross-sectional area through which the main-pulse laser beam 272 may pass.

The additional space may be used to provide a supply of purging gas through the hole 305. The supply of purging gas may be provided from the radiation collector CO side of the foil trap FT to the plasma 210 side of the foil trap FT through the hole 305. The supply of purging gas may reduce the flow of contaminants from the plasma 210 through the hole 305 and may further reduce contamination of the radiation collector CO.

Figure 8:
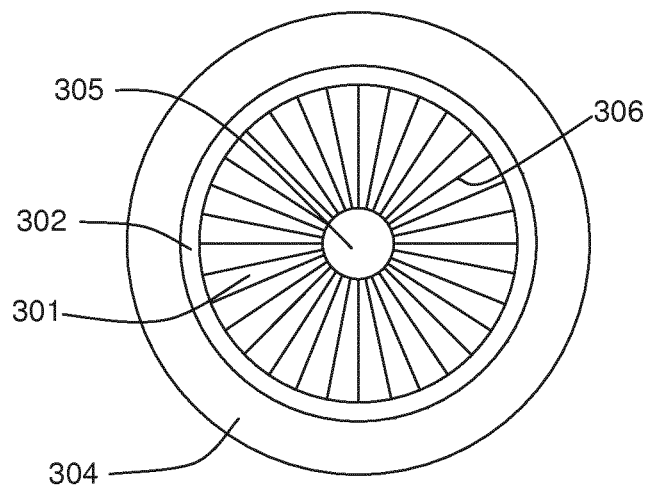
FIG. 8 is a front on view of the foil trap FT of FIG. 7.

The rotating foil trap FT, provided with a drive system close to the outer perimeter of the foil trap FT, is depicted in FIG. 8 as comprising part of a radiation source SO which directs EUV radiation to a single intermediate focus IF. A rotating foil trap FT, provided with a drive system close to the outer perimeter of the foil trap FT, may also comprise a part of a radiation source SO which directs EUV radiation to more than one intermediate focus IF such as the radiation source SO depicted in FIGS. 3-6.

Figure 9:
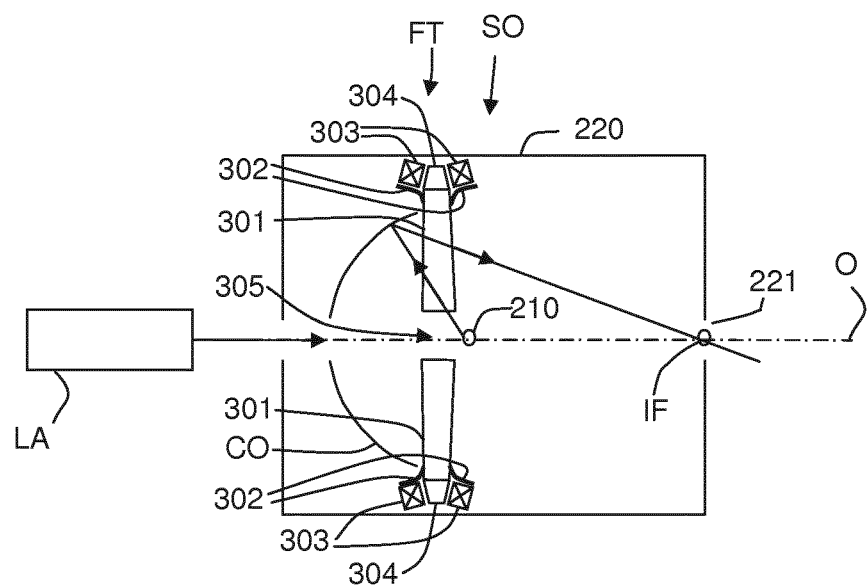
FIG. 9 is an alternative embodiment of a radiation source SO having a foil trap FT.

A rotating foil trap FT, provided with a drive system close to the outer perimeter of the foil trap FT, may also comprise part of other types of radiation source SO such as a radiation source comprising a near normal incidence radiation collector CO. An embodiment of a radiation source SO comprising a near normal incidence radiation collector CO is depicted in FIG. 9. A laser LA is arranged to deposit laser energy into a fuel, creating a plasma 210. The plasma 210 emits EUV radiation which is collected by a near normal incidence radiation collector CO and focused at an intermediate focus IF at or near an opening 221 in an enclosing structure 220. A rotating foil trap FT, provided with a drive system close to the outer perimeter of the foil trap FT, is situated between the plasma 210 and the radiation collector CO. The foil trap may prevent contaminants from the fuel and the plasma 210 from reaching the radiation collector CO. The radiation source SO may be further provided with a purging gas flow through a hole 305 in the foil trap FT. The purging gas flow may flow from the radiation collector CO side of the foil trap FT to the plasma 210 side of the foil trap FT and further prevent contaminants from the fuel and the plasma 210 from reaching the radiation collector CO.

A rotating contaminant trap comprising a plurality of foil sheets (which may be referred to as a rotating foil trap) may impact contaminants (originating from the fuel and the plasma 210) which pass through the contaminant trap with a velocity which is less than a maximum trap velocity $v_{max}$. The maximum trap velocity $v_{max}$ is a function of the number of foil sheets $n_f$ which make up the contaminant trap, the depth of the foil sheets $d_f$ and the angular frequency f with which the contaminant trap rotates. The maximum trap velocity is given by equation 1.

$$v_{max} = n_f d_f f \qquad (1)$$

It may be desirable to increase the maximum velocity $v_{max}$ of contaminants which are impacted by a rotating contaminant trap in order to decrease the proportion of contaminants which pass through the rotating contaminant trap and are incident on a radiation collector CO. As a contaminant trap rotates, the foil sheets may experience a centripetal load. The centripetal load increases as the angular frequency f increases. The centripetal load may impart a stress on the foil sheets of the contaminant trap. If the stress becomes too large it may cause damage to the contaminant trap. A rotating contaminant trap may have a maximum centripetal load which it may withstand before the contaminant trap becomes damaged. The contaminant trap therefore has a maximum angular frequency f with which it may rotate before the centripetal load exceeds the maximum centripetal load and the contaminant trap becomes damaged. The angular frequency f is one of the factors which limits the maximum trap velocity $v_{max}$ (see equation 1). It may therefore be desirable to increase the maximum angular frequency f in order to increase the maximum trap velocity $v_{max}$.

Figure 10A:
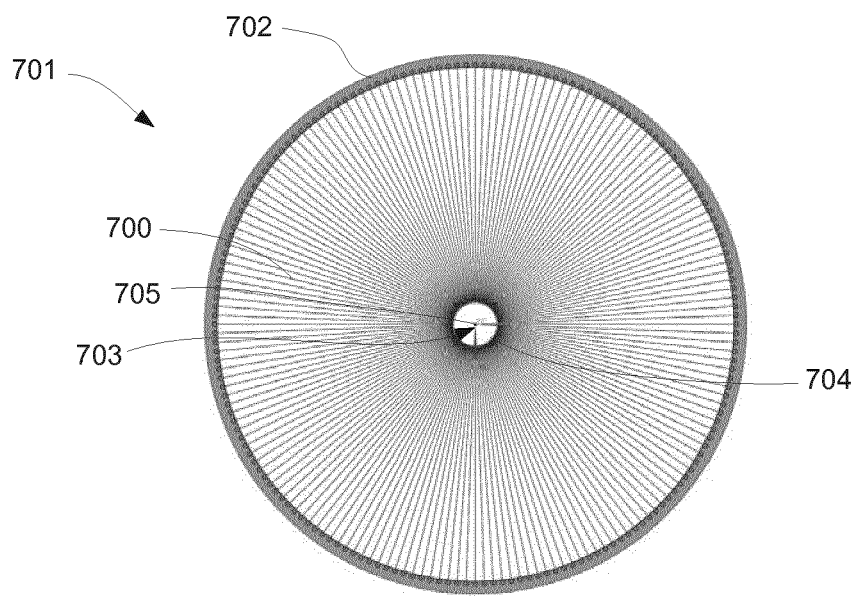
FIG. 10A is a schematic depiction of a contaminant trap having an inner ring and an outer ring.

FIG. 10A is a schematic depiction of a contaminant trap 701 comprising a plurality of foil sheets 700 extending between an inner ring 704 and an outer ring 702. The foil sheets 700 may, for example, be sheets of molybdenum. The inner ring and the outer ring are disposed around a central axis 705 of the contaminant trap 701. The central axis 705 may, for example, be aligned with an optical axis O of a radiation source SO. The inner ring 704 is disposed at a first radial distance from the central axis 705 and the outer ring 702 is disposed at a second radial distance from the central axis 705, the second radial distance being greater than the first radial distance. The inner ring 704 may be a hollow cylinder which surrounds a hole 703. When in use in a radiation source SO, a laser beam may pass through the hole 703 and may be incident on a location from which a fuel emits EUV radiation.

Figure 10B:
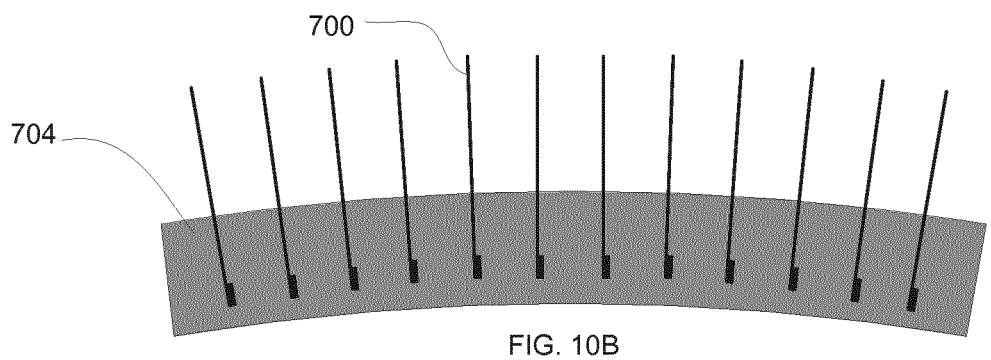
FIG. 10B is close up view of a portion of the inner ring of the contaminant trap depicted in FIG. 10A.

FIG. 10B is a close up view of a portion of the inner ring 704. The foil sheets 700 are attached to the inner ring 704.

Figure 10C:
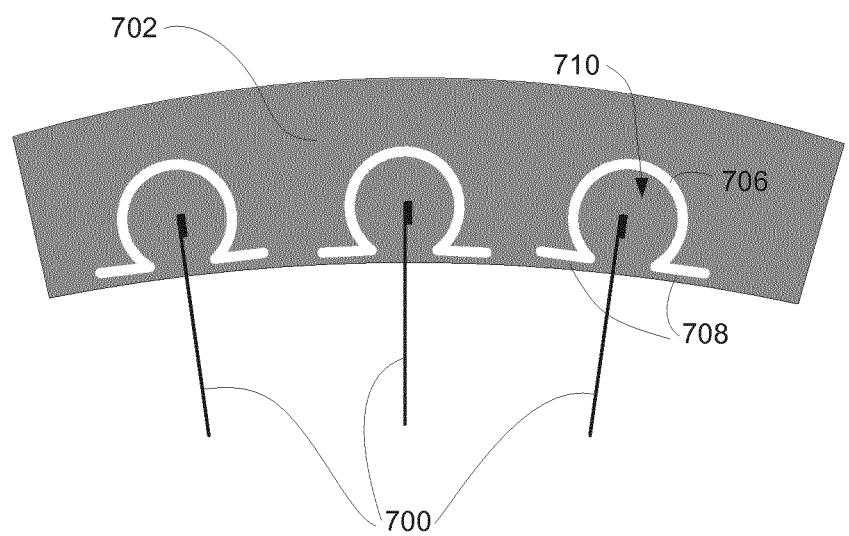
FIG. 10C is a close up view of a portion of the outer ring of the contaminant trap depicted in FIG. 10A.

FIG. 10C is a close up view of a portion of the outer ring 702. The outer ring 702 includes a plurality of gaps 706 which are cut out of the outer ring 702. The gaps 706 define spring sections 710 of the outer ring 702 to which the radially distal ends of the foil sheets 700 are attached. The spring sections 710, to which the foil sheets 700 are attached, are connected to the main body of the outer ring 702 by arms 708. The arms 708 are flexible such that the spring sections 710 may be forced radially inwards or outwards. The spring sections 710 may be forced radially inwards or outwards under a force exerted on the spring sections 710 by the foil sheets 700 attached to the spring sections 710. The arms 708 may, for example, have a length of approximately 6 mm, a height of approximately 160 microns and a depth of approximately 40 mm The contaminant trap 701 may be rotated by driving the inner ring 704 to rotate. For example a motor (not shown) may be configured to drive the inner ring 704 to rotate. Alternatively the contaminant trap 701 may be rotated by driving the outer ring 702 to rotate. For example a motor (not shown) may be configured to drive the outer ring 702 to rotate.

The outer ring 702 acts to reduce the stress imparted on the foil sheets 700 as the contaminant trap 701 rotates. The outer ring 702 therefore allows the contaminant trap 701 to rotate with an increased angular frequency f before the contaminant trap 701 becomes damaged. Rotating the contaminant trap 701 at an increased angular frequency f increases the maximum trap velocity $v_{max}$. Increasing the maximum trap velocity decreases the proportion of contaminants which pass through the rotating contaminant trap and are incident on a radiation collector CO. This may reduce contamination of the radiation collector CO, thereby increasing the useful lifetime of the radiation collector CO.

Alternatively, increasing the angular frequency f with which the contaminant trap 701 rotates may allow the number of foil sheets $n_f$ to be reduced without substantially reducing the maximum trap velocity $v_{max}$. Reducing the number of foil sheets $n_f$ reduces the total cross-sectional area of the foil sheets 700 and therefore reduces the amount of EUV radiation which is blocked by the foil sheets 700. Additionally or alternatively the depth $d_f$ of the foil sheets 700 may be reduced without substantially reducing the maximum trap velocity $v_{max}$. Reducing the depth $d_f$ of the foil sheets 700 may reduce the space required in the radiation source SO for the contaminant trap 701. This may free up space in the radiation source SO for other components of the radiation source SO.

During use in a radiation source SO, components of the contaminant trap 701 may expand thermally and/or mechanically. The flexible arms 708 which join the spring sections 710 to the outer ring 702 allow the radially distal ends of the foil sheets 700 to move radially inwards and outwards. This allows for thermal and/or mechanical expansion of components of the contaminant trap 701 without imparting a damaging stress on the foil sheets 700.

For example, as the contaminant trap 701 rotates, centripetal forces may cause the foil sheets 700 to lengthen. Lengthening of the foil sheets 700 may cause the arms 708 to flex such that the spring sections 710, to which the radially distal ends of the foil sheets 700 are attached, move radially outwards.

During operation the contaminant trap 701 may be subject to heating. For example, the contaminant trap 701 may be heated by EUV radiation incident on the contaminant trap 701. The contaminant trap 701 may be further heated by ions originating from the fuel and the plasma 210. Heating of the contaminant trap 701 may cause components of the contaminant trap 701 to expand. For example, the inner ring 704 may expand under heating. This may cause the points on the inner ring to which the foil sheets 700 are attached to move radially outwards. This may cause the foil sheets 700 including the radially distal ends of the foil sheets 700 to move radially outwards, thus causing the arms 708 to flex and the spring sections 710, to which the radially distal ends of the foil sheets 700 are attached, to move radially outwards. The foil sheets 700 may also be heated and may expand and lengthen. Lengthening of the foil sheets 700 may cause further flexing of the arms 708 such that the spring sections 710 move further radially outwards.

During use the foil sheets 700 may impact contaminants originating from the fuel and the plasma 210. The contaminants may be flung radially outwards by the rotation of the contaminant trap 701. It may therefore be desirable to provide the outer ring 702 with openings through which contaminants, which impact the foil sheets 700, may be flung radially outwards.

Figure 11A:
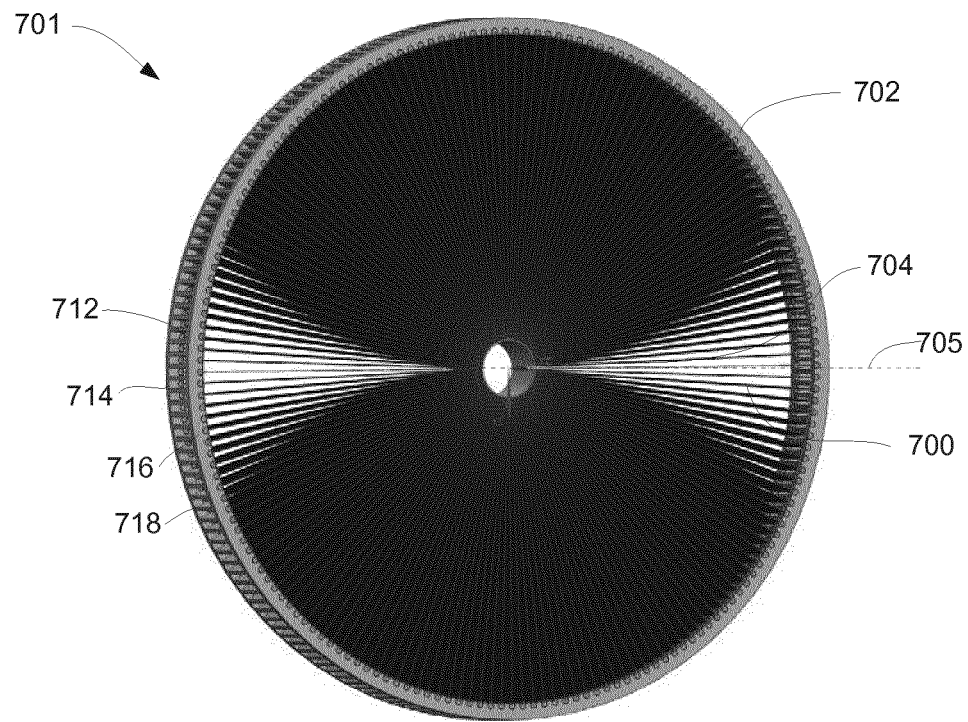
FIG. 11A is an oblique perspective of a contaminant trap having an outer ring in which there is a plurality of openings.
Figure 11B:
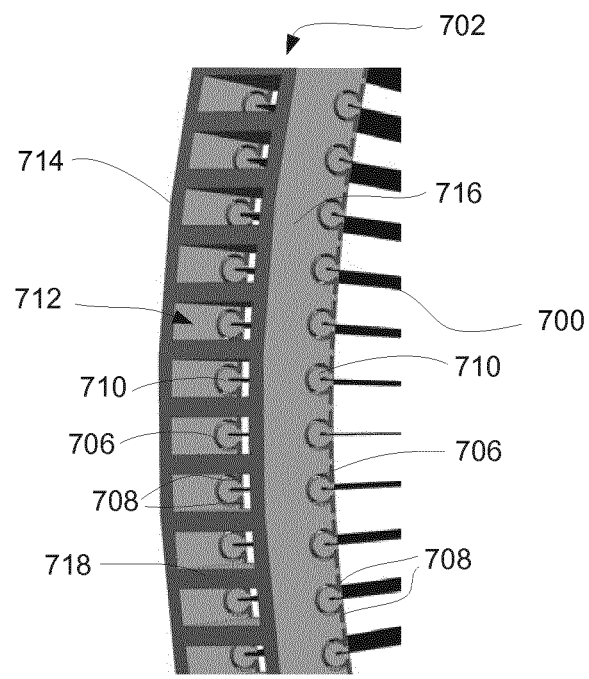
FIG. 11B is a close up view of a portion of the outer ring of the contaminant trap depicted in FIG. 11A.

FIG. 11A is an oblique perspective of an embodiment of a contaminant trap 701. FIG. 11B is a close up view of a portion of the perspective shown in FIG. 11A. In the embodiment depicted in FIGS. 11A and 11B the outer ring 702 may be considered to comprise a first ring 714 and a second ring 716. The first and second rings are joined by bridging sections 718. The first and second rings both include a plurality of gaps 706 which define spring sections 710 of the first and second rings to which the radially distal ends of the plurality of foil sheets 700 are attached. The spring sections 710 are connected to the main body of the first and second rings by flexible arms 708 which allow the spring sections and hence the radially distal ends of the foil sheets 700 to move radially inwards and outwards.

The bridging sections 718 are separated by openings 712 through which contaminants may pass. Contaminants may be flung radially outwards by the rotation of the contaminant trap 701 and may pass through the openings 712. A contaminant collector (not shown) may be positioned adjacent to the contaminant trap 701 and may be configured to receive contaminants which are flung radially outwards from the contaminant trap 701.

In an alternative embodiment the depth in an axial direction of the outer ring 702 may be substantially less than the depth of the foil sheets 700. In this embodiment the outer ring 702 may comprise a single ring and may not include openings 712 through which contaminants may pass. Contaminants impacted by the foil sheets 700 may instead pass radially outwards at a position axially forward or aft of the outer ring 702.

Figure 12A:
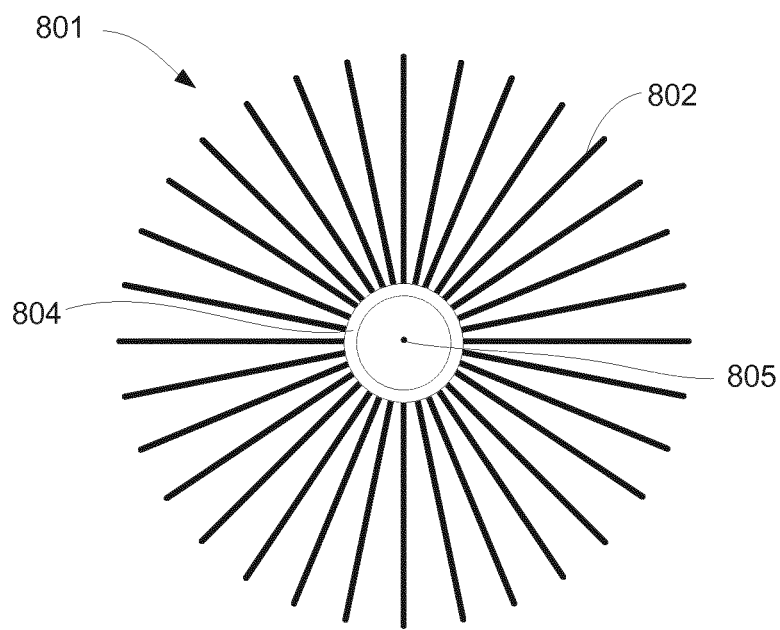
FIG. 12A is a schematic depiction of a contaminant trap comprising a plurality of fibres.
Figure 12B:
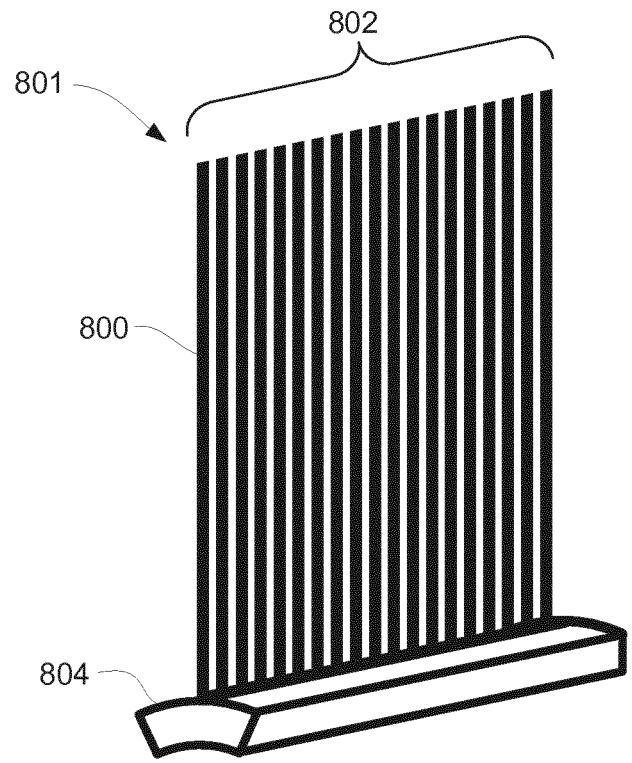
FIG. 12B is an oblique perspective of a portion of the contaminant trap depicted in FIG. 12A.

FIG. 12A schematically depicts an alternative contaminant trap 801 comprising an inner ring 804 from which a plurality of rows of fibres 802 extend radially outwards. The inner ring 804 may comprise a hollow cylinder which is disposed at a radial distance from a central axis 805 of the contaminant trap 801. The central axis 805 may, for example, be aligned with an optical axis O of a radiation source SO in which the contaminant trap 801 may be positioned. FIG. 12B shows a close up oblique perspective of a portion of the contaminant trap 801 showing a single row 802 of fibres 800.

The term 'row' is not intended to mean that fibres must all have the same circumferential position. For example, a row of fibres may be formed from sets of fibres which are at substantially the same axial position but which are circumferentially displaced from one another. In an embodiment, a row of fibres may comprise two or more sub-rows of fibres. The sub-rows of fibres may be located sufficiently close to one another that contaminant may bridge a gap between them. In an embodiment, a row of fibres may comprise three sub-rows or four sub-rows.

The row 802 of fibres 800 may be aligned substantially parallel to the central axis 805. The fibres 800 may, for example, be carbon-carbon fibres which may be manufactured using polyacrylonitrile (PAN). The fibres 800 may each have a diameter of approximately 5 microns. The fibres 800 may, for example, have the following properties: a density of approximately 1800 kg m$^{-3}$, a tensile strength of approximately 5700 MPa, a Young's modulus of approximately 300 GPa, a lengthwise coefficient of thermal expansion of approximately $-0.7 \times 10^{-6}$ K$^{-1}$ and a thermal conductivity of approximately 2000 W m$^{-1}$ K$^{-1}$. These properties of the fibres 800 may be maintained up to a temperature of approximately 2800 K. The fibres 800 may behave as blackbody radiators. The fibres 800 may be hydrophobic.

The contaminant trap 801 may be rotated. For example, a motor (not shown) may be configured to drive the cylinder 804 to rotate. Upon rotation the rows of fibres 802 may impact contaminants passing through the contaminant trap 801. The rows of fibres 802 therefore operate in an analogous fashion to the foil sheets 700 of the contaminant trap 701 depicted in FIGS. 10 and 11.

The maximum trap velocity $v_{max}$ of contaminants which are impacted by rotating rows of fibres 802 may be given by equation 2.

$$v_{max} = n_r d_r f \qquad (2)$$

Where $n_r$ is the number of rows of fibres on the contaminant trap 802, $d_r$ is the depth of each row of fibres 802 (for example $d_r$ may be the depth of each row of fibres along the central axis 805) and f is the angular frequency with which the contaminant trap 801 rotates.

The fibres 800 have a substantially lower density than the foil sheets 700. The centripetal load experienced by the fibres 800 is therefore substantially less than the centripetal load experienced by the foil sheets 700. The fibres 800 have a substantially higher tensile strength than the foil sheets 700 and can therefore withstand a substantially larger stress (imparted on the fibres due to the centripetal load) before the fibres 800 become damaged. The reduced density and higher tensile strength of the fibres 800 allow the fibres 800 to be rotated at a higher angular frequency f before the fibres become damaged (when compared to the foil sheets 700). For example, the contaminant trap 801 may be rotated at an angular frequency f of approximately 1000 Hz without the fibres 800 becoming damaged.

Increasing the angular frequency f with which a contaminant trap 801 rotates increases the maximum trap velocity $v_{max}$ of contaminants which are impacted by rows of fibres 802 (see equation 2). Increasing the angular frequency f with which the contaminant trap 801 is rotated may allow the number $n_r$ of rows of fibres 802 to be reduced without significantly reducing the maximum trap velocity $v_{max}$. Reducing the number $n_r$ of rows of fibres 802 reduces the total cross-sectional area of the rows of fibres 802 and therefore reduces the amount of EUV radiation which is blocked by the rows of fibres 802. Additionally or alternatively the depth $d_r$ of the rows of fibres 802 may be reduced without significantly reducing the maximum trap velocity $v_{max}$. Reducing the depth $d_r$ of the rows of fibres 802 may reduce the space required in a radiation source SO for the contaminant trap 801. This may free up space in the radiation source SO for other components of the radiation source SO.

A contaminant trap 801 may for example comprise approximately 250 rows of fibres 802. The contaminant trap 801 may, for example, rotate at an angular frequency of approximately 1000 Hz. The contaminant trap 801 may have a maximum trap velocity of approximately 10,000 m s$^{-1}$. The contaminant trap 801 may obstruct approximately 0.003% of EUV radiation incident on the contaminant trap 801.

A row of fibres 802 may have a smaller cross-sectional area (when viewed along the central axis 805) than a foil sheet 700. This may reduce the amount of EUV radiation which is incident on a row of fibres. This may also reduce transfer of heat from other sources. These factors may reduce the heat load which a row of fibres is subjected to during use in an EUV radiation source SO. A row of fibres 802 may conduct and radiate heat away from the row of fibres 802 more efficiently than a foil sheet 700. This may reduce the temperature increase which a row of fibres 802 undergoes during use in an EUV radiation source SO.

It may be desirable for the rows of fibres 802 to operate at a temperature greater than the melting temperature of contaminants, such as tin particles (having a melting temperature of approximately 500K), which are impacted by the rows of fibres 802. This may ensure that contaminants are in a fluid state in which they may flow along the fibres 800 and be flung radially outwards by the rotation of the contaminant trap 801. Flowing of fluid contaminants along the fibres 800 may be facilitated by the hydrophobic properties of the fibres 800 which may prevent fluid contaminants from sticking to the fibres 800. The fibres 800 may be spaced from one another such that gaps between the fibres 800 act as capillaries and fluid contaminants are forced to flow along the fibres 800 due to capillary action. Rows of fibres which comprise fibres 800 at substantially the same axial position but which are circumferentially displaced from one another may advantageously increase the flow of fluid contaminants along the fibres 800 due to capillary action.

If the rows of fibres 802 fall below the melting temperature of the contaminants which are impacted by the rows of fibres, contaminants may solidify on the fibres 800 and may become stuck to the fibres 800. However, solidified contaminants on the fibres 800 may increase the heat capacity of the fibres 800 which may act to increase the temperature of the fibres 800. As the temperature of the fibres 800 increases the contaminants may melt and flow along the fibres 800 due to the rotation of the fibres 800 and due to capillary action in between the fibres 800. The increase in heat capacity of fibres due to solidification of contaminants on the fibres may cause the fibres to reach a thermal equilibrium at a temperature close to the melting temperature of the contaminants.

Figure 13:
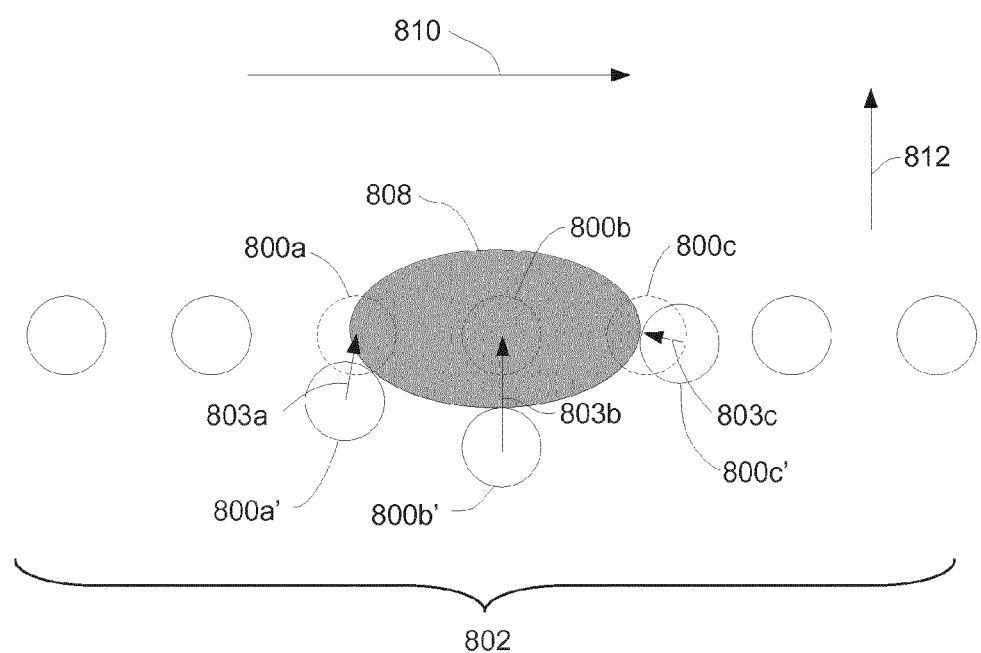
FIG. 13 is a cross-sectional view of a portion of a row of fibres impacting a contaminant.

FIG. 13 is a cross-sectional view of a portion of a row of fibres 802. The row of fibres 802 is moving in a direction indicated by an arrow 812. The row of fibres 802 may be moving, for example, due to the rotation of a contaminant trap 801 comprising the row of fibres 802. A contaminant 808 travels in a direction indicated by an arrow 810 which is substantially perpendicular to the direction of travel of the row of fibres 802. The contaminant 808 may, for example, be a particle or droplet of tin. The contaminant 808 may, for example, be travelling from a location at which a plasma is formed in an EUV radiation source SO towards a location of a radiation collector CO. It may be desirable for the row of fibres 802 to impact the contaminant 808. It may be further desirable that impacting the contaminant 808 prevents it from continuing to travel in a direction towards the radiation collector CO in order to prevent the contaminant 808 from reaching the radiation collector CO and contaminating the radiation collector CO, thereby increasing the useful lifetime of the radiation collector CO.

As the row of fibres move in the direction 812 they impact the contaminant 808. The fibres which impact the contaminant 808 may deform from their position in the row of fibres 802. For example three fibres are depicted in FIG. 13 having been deformed, by impact with the contaminant 808, from their positions 800*a*, 800*b* and 800*c* in the row of fibres 802 to deformed positions 800*a*', 800*b*' and 800*c*' respectively. As the fibres are deformed from their original positions 800*a*, 800*b* and 800*c* in the row of fibres 802, tension in the fibres produces a force which acts to return the fibres to their original positions 800*a*, 800*b* and 800*c*. These forces are represented by arrows 803*a*, 803*b* and 803*c* in FIG. 13. The forces 803*a* and 803*b* are predominantly in the direction of travel 812 of the row of fibres 802. The force 803*c* has a substantial component in a direction which opposes the direction of travel 810 of the contaminant 808. The force 803*c* therefore acts to decelerate the contaminant 808 in its direction of travel 810. A contaminant trap 801 comprising rows of fibres 802 is therefore advantageous since the fibres 800 deform on impact with a contaminant in such a way that the contaminant's momentum in the direction of its travel is reduced by the fibres. This reduces the chance that the contaminant will bounce off the row of fibres 802 and continue travelling in a direction towards a radiation collector CO. This reduces the number of contaminants which reach the radiation collector CO and contaminate the radiation collector CO, thereby increasing the useful lifetime of the radiation collector CO.

Figure 14A:
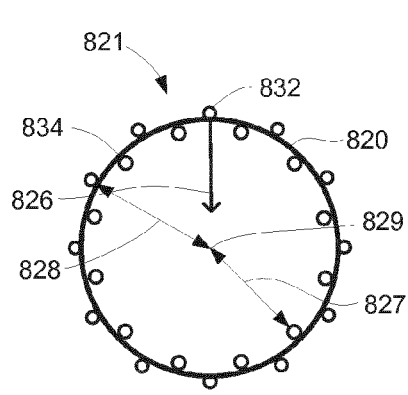
FIG. 14 is a schematic depiction of a method of assembly of a contaminant trap comprising a plurality of fibres.
Figure 14B:
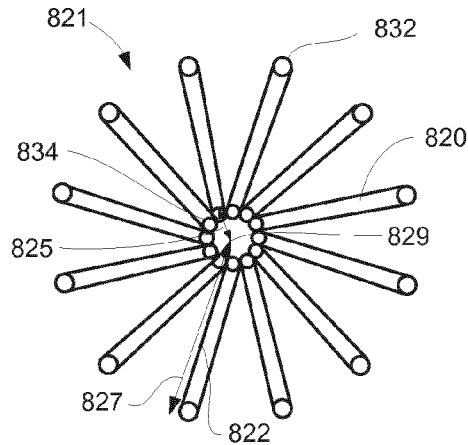

FIGS. 14A and 14B schematically depict a method of assembly of a contaminant trap 821 comprising a fibre 820. FIG. 15A shows a first plurality of shafts 834 positioned in a circular arrangement at a first radial distance 827 from a central axis 829 of the contaminant trap 821. A second plurality of shafts 832 are positioned in a circular arrangement at a second radial distance 828 from the central axis 829. A continuous fibre 820 is arranged in between the first 834 and second 832 pluralities of shafts. The shafts 834 and 832 may for example be hollow cylinders having some axial extent. Further continuous fibres 820 are positioned in between the first and second pluralities of shafts at different positions along the axial extent of the shafts, thereby forming a row of continuous fibres.

The first plurality of shafts 834 are moved towards the central axis 829 of the contaminant trap 821 as indicated by the arrow 826. FIG. 14B depicts the contaminant trap 821 after the first plurality of shafts have been moved towards the central axis 829 such that they lie at a radial distance 825 from the central axis 829. The fibres 820 are stretched such that they extend towards and away from the central axis 829. The fibres 820 therefore comprise portions 822 which extend between the positions of the first plurality of shafts 834 at a first radial distance 825 from the central axis 829 and the positions of the second plurality of shafts 832 at a second radial distance 827 from the central axis, wherein the second radial distance 827 is greater than the first radial distance 825. The contaminant trap 821 may further comprise rigid structures which hold the shafts 832 and 834 in position. The contaminant trap 821 may be driven to rotate, for example, by a motor (not shown) configured to rotate the shafts 834 and/or the shafts 832.

Figure 15:
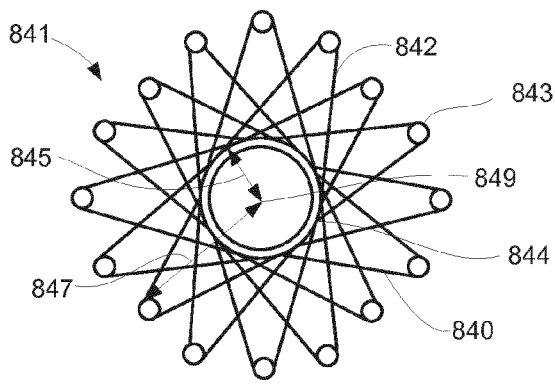
FIG. 15 is a schematic depiction of an alternative embodiment of a contaminant trap comprising a plurality of fibres.

FIG. 15 schematically depicts a contaminant trap 841 comprising a cylinder 844 having an outer radius 845. The cylinder is disposed around a central axis 849 of the contaminant trap 841. The contaminant trap 841 further comprises a plurality of shafts 843 arranged at a radial distance 847 from the central axis 849. Fibres 840 are wound around the cylinder 844 and the plurality of shafts 843 in the manner depicted in FIG. 15. The shafts 843 and the cylinder 844 have some axial extent in the direction of the central axis 849. Further fibres 840 are wound around the cylinder 844 and the shafts 843 at different axial positions along the cylinder 844 and the shafts 843, thereby forming rows of fibres 840. Portions 842 of the fibres 840 extend between the position of the cylinder 844 at a first radial distance 845 from the central axis 849 to the position of the shafts 843 at a second radial distance 847 from the central axis 849, wherein the second radial distance 847 is greater than the first radial distance 845. The contaminant trap 841 may further comprise rigid structures which hold the shafts 843 in position. The contaminant trap 841 may be driven to rotate, for example, by a motor (not shown) configured to rotate the cylinder 844 and/or the shafts 843.

The fibres 820 and 840 of the contaminant traps 821 and 841 may be cut close to the shafts 832 and 843 respectively and the shafts removed from the contaminant traps 821 and 841. The fibres 820 and 840 may be sufficiently rigid to remain in position without the shafts 832 and 843.

Figure 16A:
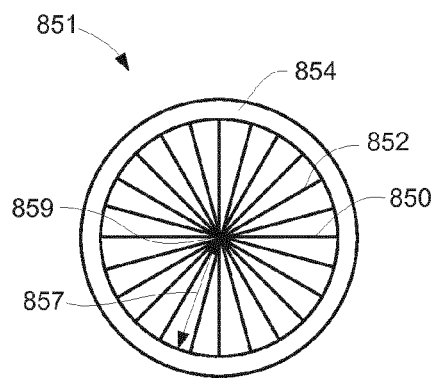
FIG. 16A is a schematic depiction of a further alternative embodiment of a contaminant trap comprising a plurality of fibres.

FIG. 16A depicts a contaminant trap 851 comprising a cylinder 854 having an inner radius 857. Fibres 850 are attached to different points of the inner circumference of the cylinder 854 such that they extend substantially through a central axis 859 of the contaminant trap 851. The cylinder 854 has some axial extent in the direction of the central axis 859. Further fibres are attached to the inner circumference of the cylinder 854 at different axial positions along the cylinder 854, thereby forming rows of fibres 850. The fibres 850 comprise portions 852 which extend between a position on the central axis 859 and a position on the cylinder 854 at a radial distance 857 from the central axis 859. The contaminant trap 851 may be driven to rotate by, for example, a motor (not shown) configured to drive the cylinder 854 to rotate. The cylinder 854 may, for example, comprise carbon-carbon fibres which may increase the strength of the cylinder 854.

Figure 16B:
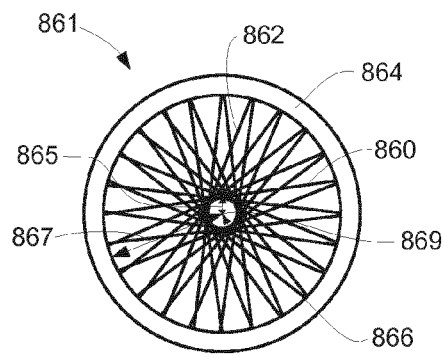
FIG. 16B is a schematic depiction of a still further alternative embodiment of a contaminant trap comprising a plurality of fibres.

FIG. 16B depicts a contaminant trap 861 comprising a cylinder 864 having an inner radius 867. Fibres 860 are attached to different points on the inner circumference of the cylinder 864 such that they extend across the cylinder 864 without passing through a central axis 869 of the contaminant trap 861. The fibres 860 are positioned in such a manner that they define a central hole 866 in which there are no fibres 860. The central hole has a radius 865. The cylinder 864 has some axial extent in the direction of the central axis 869. Further fibres are attached to the inner circumference of the cylinder 864 at different axial positions along the cylinder 864, thereby forming rows of fibres 860. The fibres 860 comprise portions 862 which extend between a position on the edge of the hole 866 at a first radial distance 865 from the central axis 869 and a position on the cylinder 864 at a second radial distance 867 from the central axis 869, wherein the second radial distance 867 is greater than the first radial distance 865. The contaminant trap 861 may be driven to rotate by, for example, a motor (not shown) configured to drive the cylinder 864 to rotate. The cylinder 864 may, for example, comprise carbon-carbon fibres which may increase the strength of the cylinder 864.

The contaminant traps 851 and 861 depicted in FIGS. 16A and 16B do not comprise any bodies close to the central axes 859, 869 of the contaminant traps which substantially obstruct EUV radiation propagating substantially parallel to the central axes 859, 869. The contaminant traps 851 and 861 may therefore be advantageously employed in a radiation source SO without obstructing a substantial portion of EUV radiation incident on the contaminant traps 851 and 861.

Alternative embodiments of contaminant traps comprising a plurality of fibres configured in arrangements other than those depicted and described above are contemplated herein. In an alternative embodiment, fibres may be deposited onto foil sheets to improve the thermal behavior and hydrophobic properties of the foil sheets.

The term extreme ultraviolet (EUV) radiation source may be interpreted as referring to electromagnetic radiation having a wavelength within the range of 5-20 nm, for example within the range of 13-14 nm, or for example within the range of 5-10 nm such as 6.7 nm or 6.8 nm.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

The invention claimed is:

1. A radiation collector comprising:
   a first collector segment comprising a plurality of grazing incidence reflector shells configured to direct radiation to substantially converge in a first location at a distance from the radiation collector; and
   a second collector segment comprising a plurality of grazing incidence reflector shells configured to direct a second portion of the radiation to substantially converge in a second location at said distance from the radiation collector;
   wherein the first location and the second location are separated from one another,
   wherein the radiation directed by the radiation collector defines a volume up to the first and second locations through which substantially no radiation directed by the radiation collector passes, and
   wherein a cross-sectional area of the volume increases with distance from the radiation collector.

2. The radiation collector of claim 1 further comprising at least one additional collector segment, wherein each additional collector segment comprises a plurality of grazing incidence reflector shells configured to direct respective portions of radiation to substantially converge in a location at said distance from the radiation collector, wherein the location of each additional collector segment is separate from the respective locations of the other collector segments.

3. The radiation collector of claim 1, wherein the collector segments are disposed around an optical axis of the radiation collector.

4. The radiation collector of claim 3, wherein each collector segment comprises a respective angular portion of the radiation collector.

5. The radiation collector of claim 3, wherein the radiation collector extends substantially circumferentially around the optical axis.

6. The radiation collector according to claim 3, wherein the first and second location are situated substantially equidistant from the optical axis.

7. The radiation collector according to claim 1, wherein the radiation directed by the first collector segment to the first location forms a first intensity distribution of radiation at a far-field location, and the radiation directed by the second collector segment to the second location forms a second intensity distribution of radiation at the far-field location.

8. The radiation collector according to claim 7, wherein there is substantially no overlap between the first intensity distribution and the second intensity distribution at the far field location.

9. A radiation source comprising:
a fuel source configured to deliver fuel to a location from which the fuel emits EUV radiation; and
a radiation collector comprising:
a first collector segment comprising a plurality of grazing incidence reflector shells configured to direct a first portion of radiation to substantially converge in a first location at a distance from the radiation collector; and
a second collector segment comprising a plurality of grazing incidence reflector shells configured to direct a second portion of the radiation to substantially converge in a second location at said distance from the radiation collector;
wherein the first location and the second location are separated from one another,
wherein the radiation directed by the radiation collector defines a volume up to the first and second locations through which substantially no radiation directed by the radiation collector passes, and
wherein a cross-sectional area of the volume increases with distance from the radiation collector.

10. The radiation source of claim 9, wherein the collector segments are disposed around an optical axis of the radiation collector, and the location from which the fuel emits EUV radiation is positioned on or near the optical axis.

11. The radiation source of claim 9, wherein the radiation source further comprises a mirror disposed inside the volume, and the mirror is configured to focus a laser beam at the location from which the fuel emits EUV radiation.

12. The radiation source of claim 9, wherein the radiation source further comprises a contaminant trap in between the fuel source and the radiation collector, wherein the contaminant trap comprises a trap section configured to trap contaminants, and a drive system configured to rotate the trap section about a central axis of the contaminant trap, and wherein at least a part of the drive system is disposed inside the volume.

13. A lithographic apparatus comprising a radiation source configured to project EUV radiation from the radiation source onto a substrate, wherein the radiation source comprises:
a fuel source configured to deliver fuel to a location from which the fuel emits the EUV radiation; and
a radiation collector comprising:
a first collector segment comprising a plurality of grazing incidence reflector shells configured to direct a first portion of radiation to substantially converge in a first location at a distance from the radiation collector; and
a second collector segment comprising a plurality of grazing incidence reflector shells configured to direct a second portion of the radiation to substantially converge in a second location at said distance from the radiation collector;
wherein the first location and the second location are separated from one another,
wherein the radiation directed by the radiation collector defines a volume up to the first and second locations through which substantially no radiation directed by the radiation collector passes, and
wherein a cross-sectional area of the volume increase with distance from the radiation collector.

14. The lithography apparatus of claim 13, wherein the first and second collector segments are disposed around an optical axis of the radiation collector.

15. The lithography apparatus of claim 14, wherein the first and second locations are situated substantially equidistant from the optical axis.

16. The lithography apparatus of claim 14, wherein the radiation collector extends substantially circumferentially around the optical axis.

17. The lithography apparatus of claim 13, wherein the radiation directed by the first collector segment to the first location forms a first intensity distribution of radiation at a far-field location, and the radiation directed by the second collector segment to the second location forms a second intensity distribution of radiation at the far-field location.

18. The lithography apparatus of claim 17, wherein there is substantially no overlap between the first and second intensity distributions at the far field location.

* * * * *

UNITED STATES PATENT AND TRADEMARK OFFICE
CERTIFICATE OF CORRECTION

PATENT NO. : 9,983,482 B2
APPLICATION NO. : 14/775263
DATED : May 29, 2018
INVENTOR(S) : Loopstra et al.

Page 1 of 1

It is certified that error appears in the above-identified patent and that said Letters Patent is hereby corrected as shown below:

In the Claims

In Column 28, Line 44, Claim 1 please replace "direct radiation" with --direct a first portion of radiation--.
In Column 29, Line 10, Claim 6 please replace "according to" with --of--.
In Column 29, Line 13, Claim 7 please replace "according to" with --of--.
In Column 29, Line 20, Claim 8 please replace "according to" with --of--.
In Column 30, Line 33, Claim 13 please replace "volume increase" with --volume increases--.

Signed and Sealed this
Eleventh Day of December, 2018

Andrei Iancu
*Director of the United States Patent and Trademark Office*